(12) United States Patent
Kim et al.

(10) Patent No.: US 10,672,479 B2
(45) Date of Patent: Jun. 2, 2020

(54) NONVOLATILE MEMORY DEVICES, MEMORY SYSTEMS AND METHODS OF OPERATING NONVOLATILE MEMORY DEVICES FOR PROCESSING USER DATA

(71) Applicant: Samsung Electronics Co., Ltd., Suwon-si, Gyeonggi-do (KR)

(72) Inventors: Taek-Soo Kim, Suwon-si (KR); Chan-Ik Park, Seongnam-si (KR); Hyun-Sung Shin, Seoul (KR); Sang-Hoan Chang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/127,793

(22) Filed: Sep. 11, 2018

(65) Prior Publication Data

US 2019/0189221 A1    Jun. 20, 2019

(30) Foreign Application Priority Data

Dec. 19, 2017    (KR) .................. 10-2017-0174926

(51) Int. Cl.
*G11C 7/10* (2006.01)
*G11C 16/14* (2006.01)
(Continued)

(52) U.S. Cl.
CPC ............ *G11C 16/14* (2013.01); *G11C 7/1006* (2013.01); *G11C 7/1057* (2013.01); *G11C 16/08* (2013.01); *G11C 16/26* (2013.01); *G11C 19/287* (2013.01); *G11C 29/42* (2013.01); *G11C 5/147* (2013.01); *G11C 7/18* (2013.01); *G11C 8/14* (2013.01); *G11C 14/0054* (2013.01);
(Continued)

(58) Field of Classification Search
CPC ....... G11C 16/14; G11C 7/1057; G11C 29/42; G11C 19/287; G11C 16/08; G11C 16/26; G11C 14/0054; G11C 5/147; G11C 7/18; G11C 8/14; G11C 7/1006; G11C 16/0483; G11C 2029/0411; H01L 27/11526
USPC .................................................. 365/189.05
See application file for complete search history.

(56) References Cited

U.S. PATENT DOCUMENTS 7,107,305 B2    9/2006    Deng et al.
7,167,890 B2    1/2007    Lin et al.
(Continued)

*Primary Examiner* — Tha-O H Bui
(74) *Attorney, Agent, or Firm* — Harness, Dickey & Pierce, P.L.C.

(57) ABSTRACT

A nonvolatile memory device includes a memory cell array including a plurality of nonvolatile memory cells; a page buffer circuit connected to the memory cell array through a plurality of bit lines; a calculation circuit configured to perform a calculation on information bits and weight bits based on a calculation window having a first size, the information bits and weight bits being included in a user data set, the memory cell array being configured to store the user data set, the calculation circuit being further configured to receive the user data set through the page buffer circuit; and a data input/output (I/O) circuit connected to the calculation circuit, wherein the calculation circuit is further configured to provide an output data set to the data I/O circuit in response to the calculation circuit completing the calculation with respect to all of the information bits and the weight bits, and wherein the output data set corresponds to a result of the completed calculation.

20 Claims, 20 Drawing Sheets

(51) Int. Cl.
  *G11C 16/26* (2006.01)
  *G11C 16/08* (2006.01)
  *G11C 19/28* (2006.01)
  *G11C 29/42* (2006.01)
  *G11C 8/14* (2006.01)
  *G11C 7/18* (2006.01)
  *H01L 27/11526* (2017.01)
  *G11C 5/14* (2006.01)
  *G11C 14/00* (2006.01)
  *H01L 27/1157* (2017.01)
  *H01L 27/11582* (2017.01)
  *G11C 29/04* (2006.01)
  *G11C 16/04* (2006.01)

(52) U.S. Cl.
  CPC .. *G11C 16/0483* (2013.01); *G11C 2029/0411* (2013.01); *H01L 27/1157* (2013.01); *H01L 27/11526* (2013.01); *H01L 27/11582* (2013.01)

(56) References Cited

U.S. PATENT DOCUMENTS

| | | | |
|---|---|---|---|
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,244,629 | B2 | 1/2016 | Hsu et al. |
| 2011/0093765 | A1* | 4/2011 | Lee .............. G06F 11/1072 714/773 |
| 2011/0233648 | A1 | 9/2011 | Seol et al. |
| 2014/0040699 | A1* | 2/2014 | Kuriyama ........ H03M 13/1148 714/758 |
| 2015/0161060 | A1 | 6/2015 | Suzuki et al. |
| 2016/0062733 | A1 | 3/2016 | Tiwari |
| 2016/0350617 | A1 | 12/2016 | Willcock |
| 2017/0024337 | A1 | 1/2017 | Walker et al. |
| 2017/0133066 | A1 | 5/2017 | Tiwari |
| 2017/0237440 | A1 | 8/2017 | Zhang et al. |

* cited by examiner

| CLE | COMMAND LATCH ENABLE |
|---|---|
| ALE | ADDRESS LATCH ENABLE |
| nCE | CHIP ENABLE |
| nRE | READ ENABLE |
| nWE | WRITE ENABLE |

FIG. 18
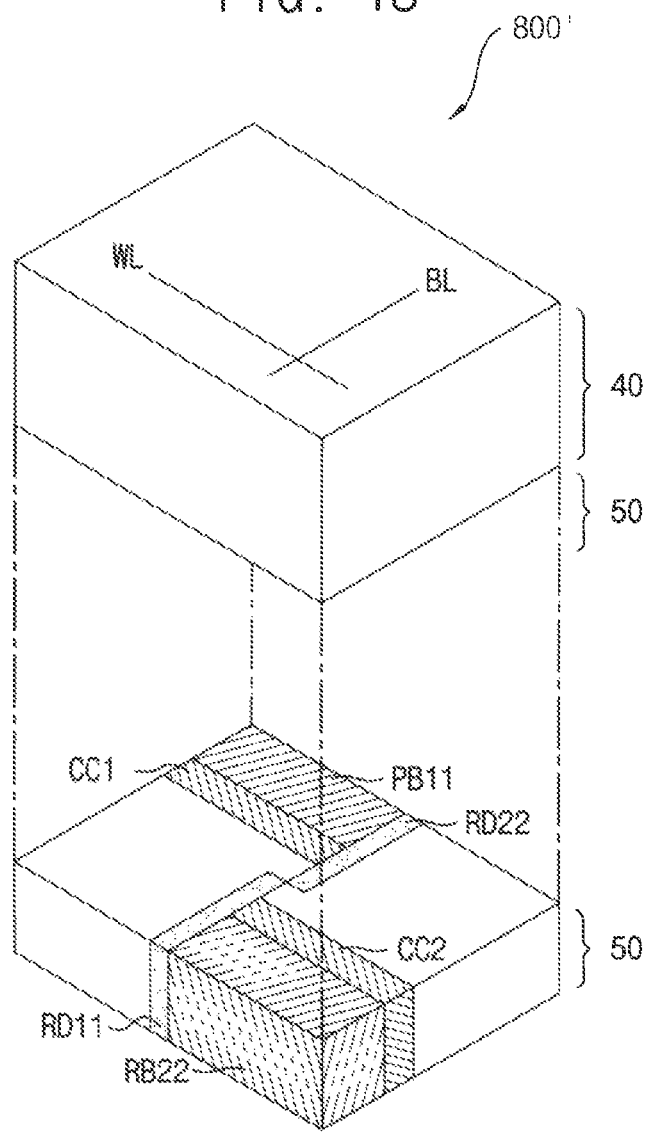
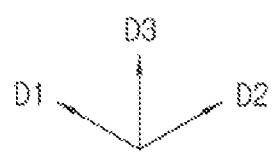

NONVOLATILE MEMORY DEVICES, MEMORY SYSTEMS AND METHODS OF OPERATING NONVOLATILE MEMORY DEVICES FOR PROCESSING USER DATA

CROSS-REFERENCE TO RELATED APPLICATION

This application claims priority under 35 USC § 119 to Korean Patent Application No. 10-2017-0174926, filed on Dec. 19, 2017, in the Korean Intellectual Property Office (KIPO), the disclosure of which is incorporated in its entirety by reference herein.

BACKGROUND

1. Technical Field

At least some example embodiments of the inventive concepts relate generally to memory devices, and more particularly to a nonvolatile memory device, a memory system including the same and a method of operating a nonvolatile memory device.

2. Discussion of the Related Art

Semiconductor memory devices are classified into volatile memory devices and nonvolatile memory devices.

A flash memory device, one of the nonvolatile memory devices, may be used as a data storage for information appliances such as a computer, a cellular phone, a personal digital assistant (PDA), a digital camera, a camcorder, a voice recorder, an MP3 player, a handheld personal computer (PC), a game machine, a facsimile, a scanner, a printer, and the like.

Various research has been conducted for reducing power consumption of the nonvolatile memory device.

SUMMARY

According to at least some example embodiments of the inventive concepts, a nonvolatile memory device includes a memory cell array including a plurality of nonvolatile memory cells; a page buffer circuit connected to the memory cell array through a plurality of bit lines; a calculation circuit configured to perform a calculation on information bits and weight bits based on a calculation window having a first size, the information bits and weight bits being included in a user data set, the memory cell array being configured to store the user data set, the calculation circuit being further configured to receive the user data set through the page buffer circuit; and a data input/output (I/O) circuit connected to the calculation circuit, wherein the calculation circuit is further configured to provide an output data set to the data I/O circuit in response to the calculation circuit completing the calculation with respect to all of the information bits and the weight bits, and wherein the output data set corresponds to a result of the completed calculation.

According to at least some example embodiments of the inventive concepts, a memory system includes at least one nonvolatile memory device; and a memory controller configured to control the at least one nonvolatile memory device, wherein the at least one nonvolatile memory device includes a memory cell array including a plurality of nonvolatile memory cells; a page buffer circuit connected to the memory cell array through a plurality of bit lines; a calculation circuit configured to perform a calculation on information bits and weight bits based on a calculation window having a first size, the information bits and weight bits being included in a user data set, the memory cell array being configured to store the user data set, the calculation circuit being further configured to receive the user data set through the page buffer circuit; and a data input/output (I/O) circuit connected to the calculation circuit, wherein the calculation circuit is further configured to provide an output data set to the data I/O circuit in response to the calculation on the information bits and the weight bits being completed, and wherein the output data set corresponds to a result of the completed calculation.

According to at least some example embodiments of the inventive concepts, a method of operating a nonvolatile memory device including a memory cell array having a plurality of nonvolatile memory cells includes providing, from the memory cell array, information bits and weight bits to a shift register block through a page buffer circuit connected to the memory cell array through a plurality of bit lines, the information bits and weight bits being included in a user data set read through the page buffer circuit; dividing, by the shift register block, the information bits and weight bits into activations and feature maps, respectively; performing, by a calculation circuit, matrix-vector multiplication on the activations and the feature maps based on a calculation window; and providing an output data set in response to the calculation circuit completing the matrix-vector multiplication with respect to all of the activations and the feature maps, the output data set corresponding to a result of the completed matrix-vector multiplication.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 18 illustrates a structure of a nonvolatile memory device including first and second semiconductor layers according to at least some example embodiments of the inventive concepts.

DETAILED DESCRIPTION OF THE EMBODIMENTS

Figures 1, 2:
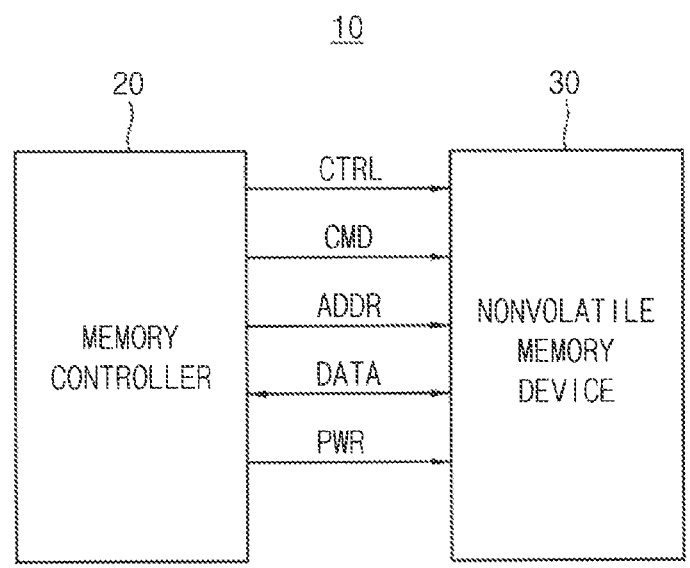
FIG. 1 is a block diagram illustrating a memory system according to at least some example embodiments of the inventive concepts.
FIG. 2 is a table illustrating control signals in the memory system of FIG. 1.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a memory system according to at least some example embodiments of the inventive concepts.

Referring to FIG. 1, a memory system (or, a nonvolatile memory system) 10 may include a memory controller 20 and at least one nonvolatile memory device 30.

The memory system 10 may include flash memory based data storage media such as a memory card, a universal serial bus (USB) memory and solid state drive (SSD).

The nonvolatile memory device 30 may perform an erase operation, a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

FIG. 2 is a table illustrating control signals in the memory system of FIG. 1.

Referring to FIGS. 1 and 2, the control signal CTRL may include a command latch enable signal CLE, an address latch enable signal ALE, a chip enable signal nCE, a read enable signal nRE, and a write enable signal nWE.

The memory controller 20 may transmit the command latch enable signal CLE to the nonvolatile memory device 30. The command latch enable signal CLE may be a signal indicating that information transferred via the input/output lines is a command. The memory controller 20 may transmit the address latch enable signal ALE to the nonvolatile memory device 30. The address latch enable signal ALE may be a signal indicating that information transferred via the input/output lines is an address.

The memory controller 20 may transmit the chip enable signal nCE to the nonvolatile memory device 30. The chip enable signal nCE may indicate a memory chip selected from among a plurality of memory chips when the nonvolatile memory device includes the plurality of memory chips.

The memory controller 20 may transmit the read enable signal nRE to the nonvolatile memory device 30. The nonvolatile memory device 30 may transmit read data to the memory controller 20 based on the read enable signal nRE.

The memory controller 20 may transmit the write enable signal nWE to the nonvolatile memory device 30. When the write enable signal nWE is activated, the nonvolatile memory device 30 may store data input signals provided from the memory controller 20 as a command CMD or an address ADDR.

Figure 3:
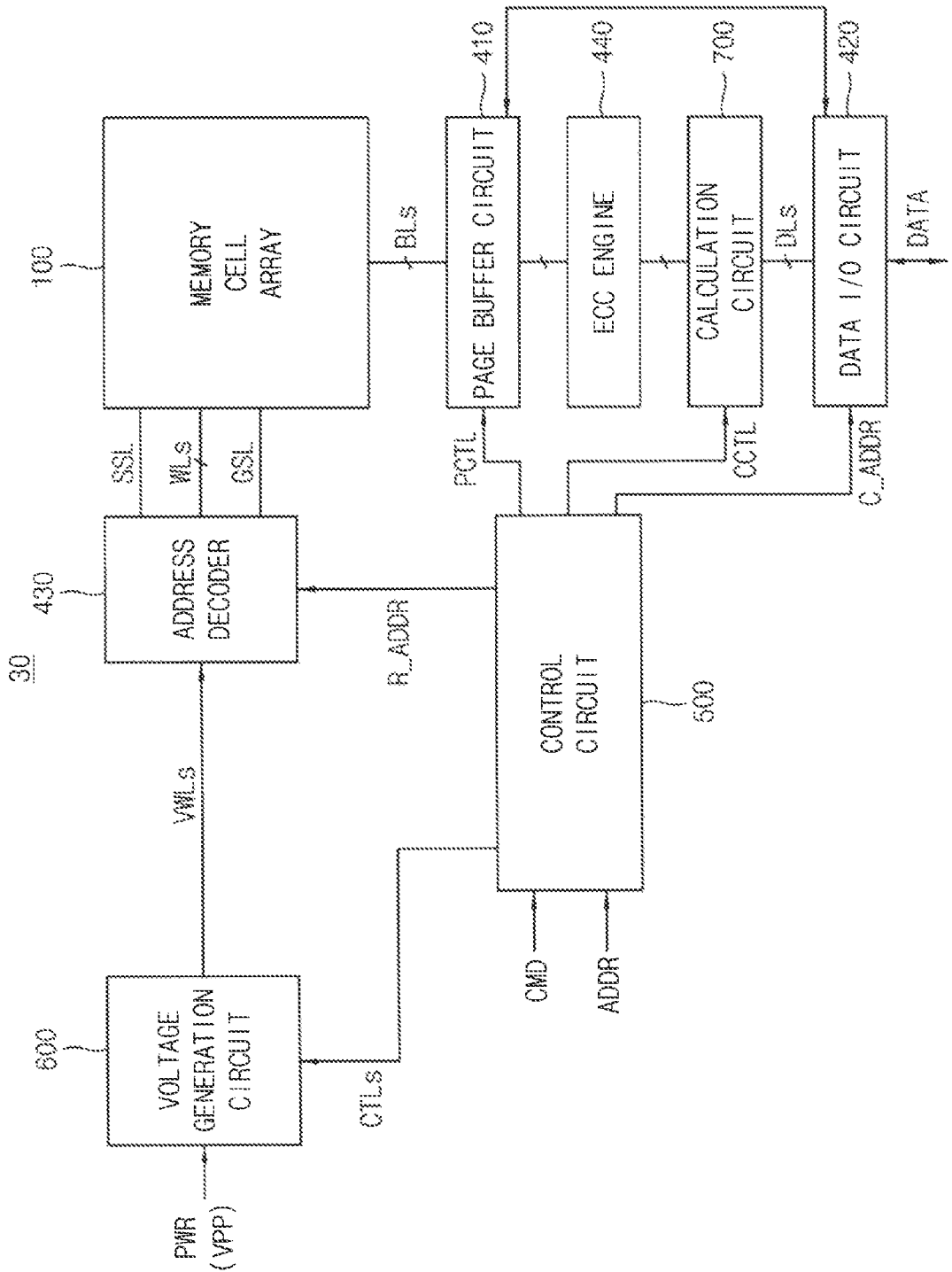
FIG. 3 is a block diagram illustrating the nonvolatile memory device of the memory system of FIG. 1 according to at least some example embodiments of the inventive concepts.

FIG. 3 is a block diagram illustrating the nonvolatile memory device of the memory system of FIG. 1 according to at least some example embodiments of the inventive concepts.

Referring to FIG. 3, the nonvolatile memory device 30 includes a memory cell array 100, an address decoder 430, a page buffer circuit 410, an error correction code (ECC) engine 440, a calculation circuit 700, a data input/output circuit 420, a control circuit 500, and a voltage generation circuit 600.

The memory cell array 100 may be coupled to the address decoder 430 through a string selection line SSL, a plurality of word lines WLs, and a ground selection line GSL. In addition, the memory cell array 100 may be coupled to the page buffer circuit 410 through a plurality of bit lines BLs. The memory cell array 100 may include a plurality of nonvolatile memory cells coupled to the plurality of word lines WLs and the plurality of bit lines BLs. The plurality of nonvolatile memory cells may be arranged in the memory cell array 100.

According to at least some example embodiments of the inventive concepts, the memory cell array 100 may be a three-dimensional memory cell array, which is formed on a substrate in a three-dimensional structure (or a vertical structure). In this case, the memory cell array 100 may include vertical cell strings stacked in vertical direction so that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and U.S. Pat. Pub. No. 2011/0233648.

According to at least some example embodiments of the inventive concepts, the memory cell array 100 may be a two-dimensional memory cell array, which is formed on a substrate in a two-dimensional structure (or a horizontal structure).

Figure 4:
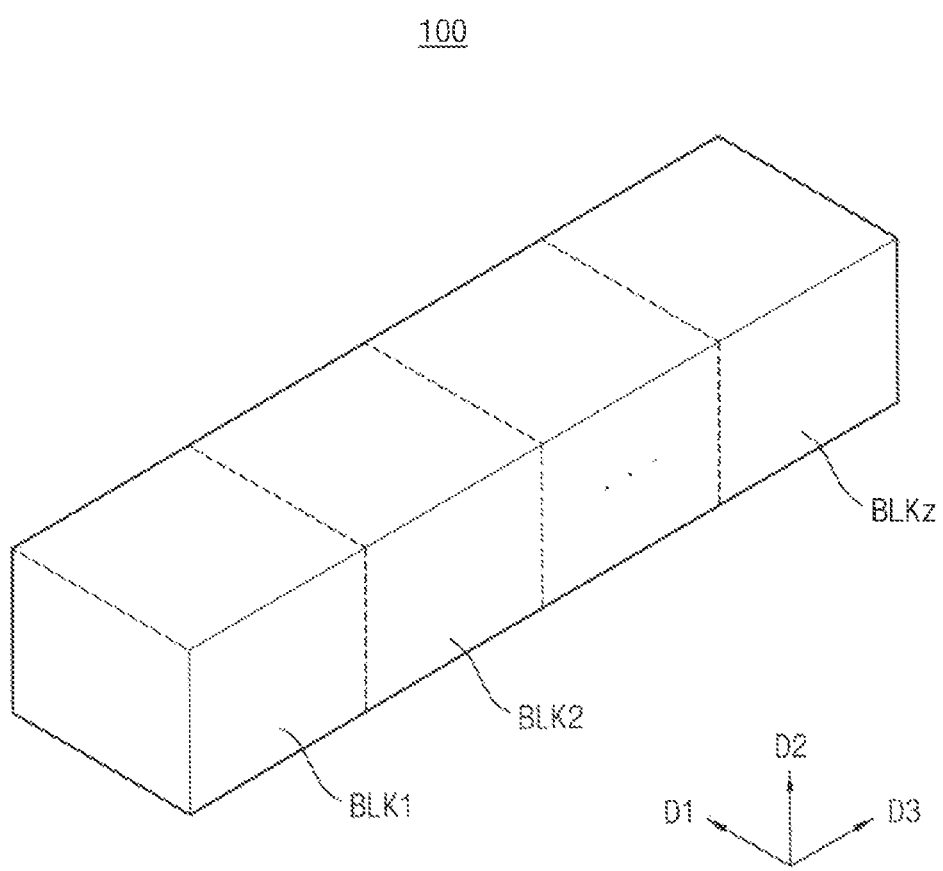
FIG. 4 is a block diagram illustrating the memory cell array in FIG. 3.

FIG. 4 is a block diagram illustrating the memory cell array in FIG. 3.

Referring to FIG. 4, the memory cell array 100 may include a plurality of memory blocks BLK1 to BLKz extending in first through third directions D1, D2 and D3. In an embodiment, the memory blocks BLK1 to BLKz are selected by the address decoder 430 in FIG. 3. For example, the address decoder 430 may select a memory block BLK corresponding to a block address among the memory blocks BLK1 to BLKz.

Figure 5:
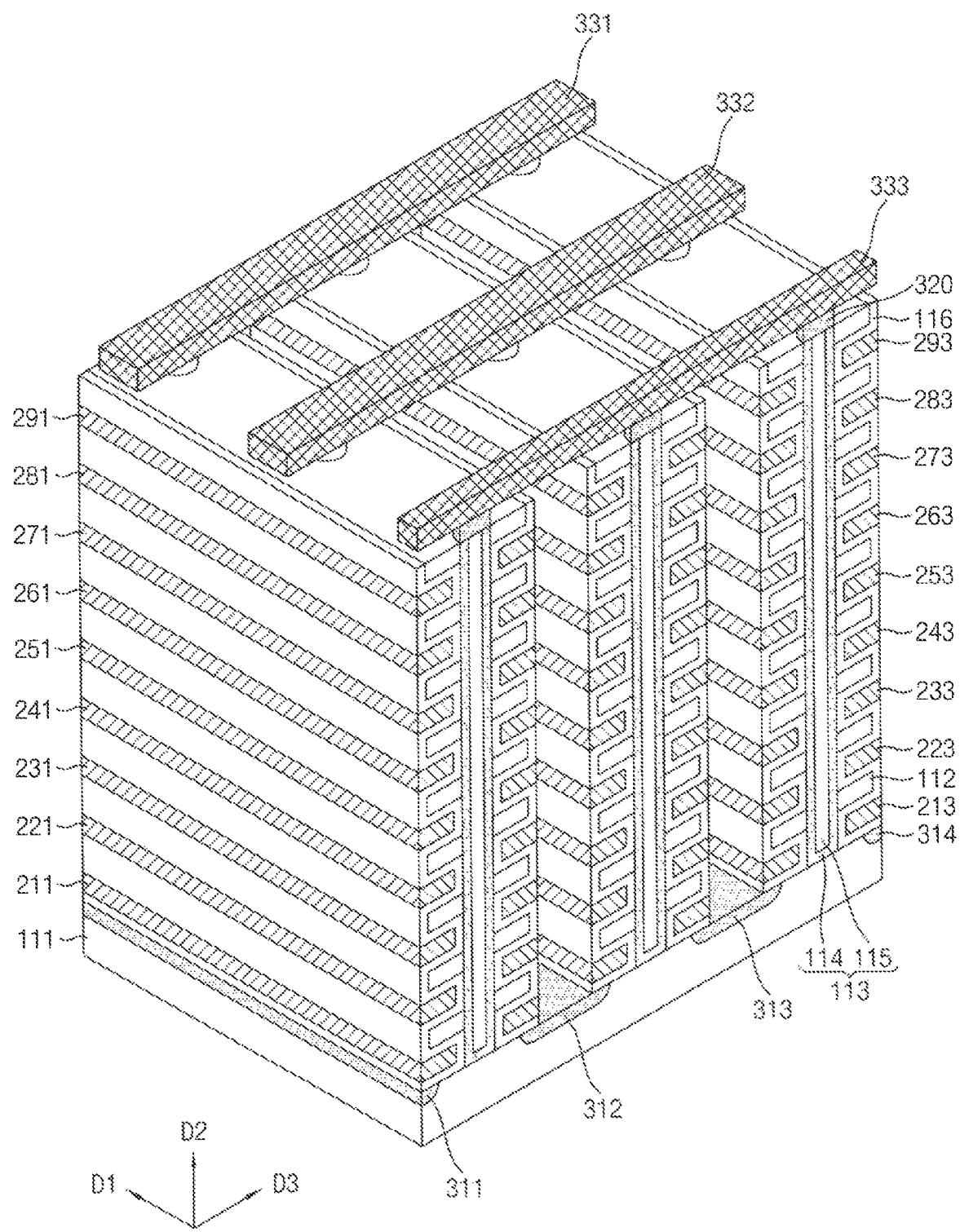
FIG. 5 is a perspective view illustrating one of the memory blocks of FIG. 4.

FIG. 5 is a perspective view illustrating one of the memory blocks of FIG. 4.

Referring to FIG. 5, the memory block BLKi includes cell strings which are formed on a substrate in a three-dimensional structure (or a vertical structure). The memory block BLKi includes structures extending along the first to third directions D1-D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type packet well). However, the conductive type of the substrate 111 is not limited to the p-type. A plurality of doping regions 311 to 314 extending along the first direction D1 are provided on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials are provided along the third direction D3, being spaced by a specific distance. According to at least some example embodiments of the inventive concepts, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. According to at least some example embodiments of the inventive concepts, the insulation layer 116 provided on the exposed surface in the second direction D2 of the last insulation material 112 may be removed.

First conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer at the bottom of the insulation material disposed on the top of the specific insulation material. That is, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 212 to 292 extending along the first direction.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the second direction D2, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Figure 6:
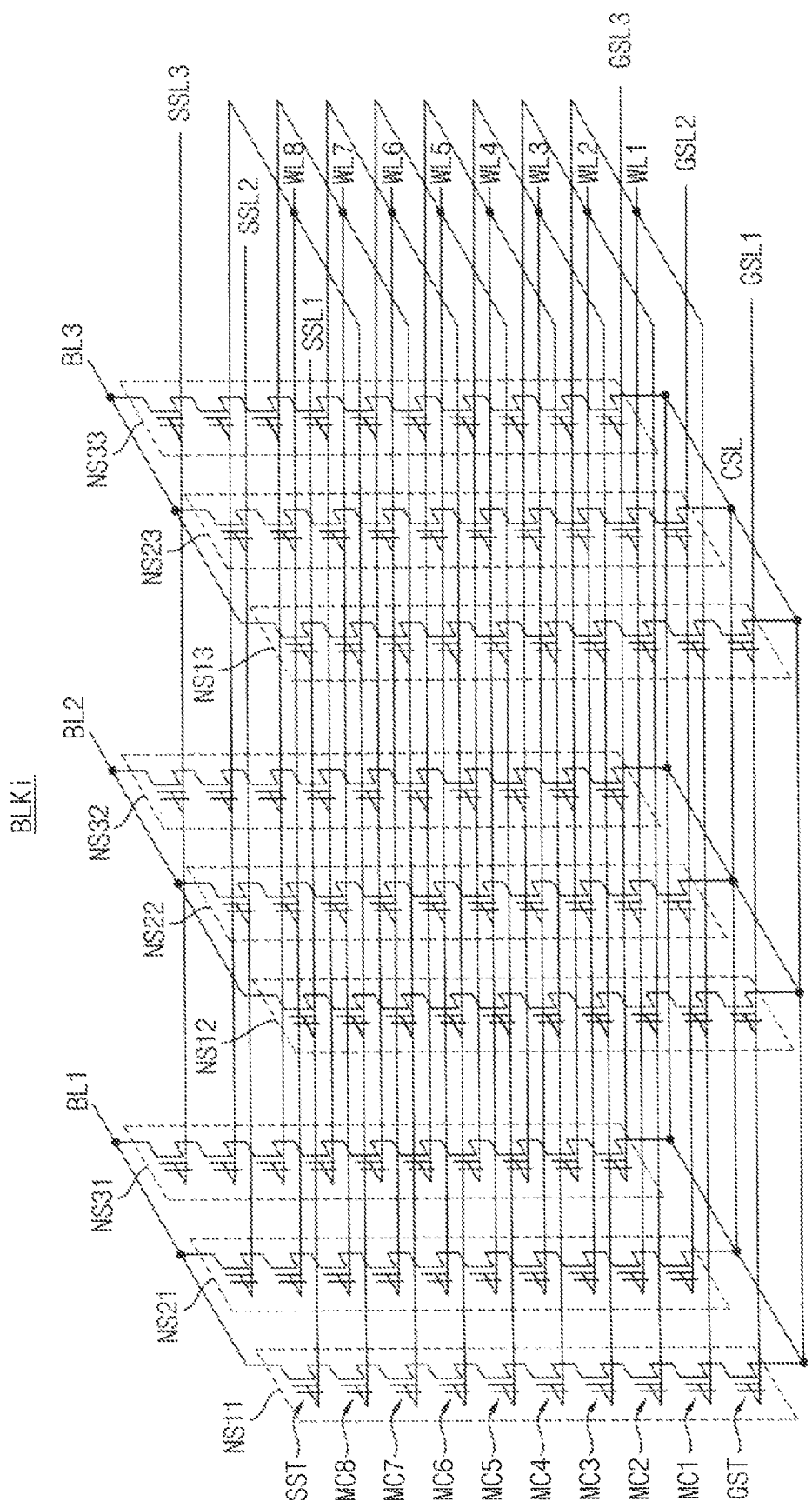
FIG. 6 is a circuit diagram illustrating an equivalent circuit of the memory block described with reference to FIG. 5.

FIG. 6 is a circuit diagram illustrating an equivalent circuit of the memory block described with reference to FIG. 5.

The memory block BLKi of FIG. 6 may be formed on a substrate in a three-dimensional structure (or a vertical structure). For example, a plurality of memory cell strings included in the memory block BLKi may be formed in a direction perpendicular to the substrate.

Referring to FIG. 6, the memory block BLKi may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, at least some example embodiments of the inventive concepts are not limited to the example illustrated in FIG. 6. For example, according to at least some example embodiments of the inventive concepts, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. In FIG. 6, the memory block BLKb is illustrated to be coupled to eight word lines WL1 to WL8 and three bit lines BL1 to BL3. However, at least some example embodiments of the inventive concepts are not limited to the example illustrated in FIG. 6. For example, according to at least some example embodiments of the inventive concepts, the memory cell array 100a may be coupled to any number of word lines and bit lines.

Referring back to FIG. 3, the control circuit 500 may receive a command (signal) CMD and an address (signal) ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation.

For example, the control circuit 500 may generate control signals CTLs, which are used for controlling the voltage generation circuit 600, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 100 through the string selection line SSL, the plurality of word lines WLs, and the ground selection line GSL. During the program operation or the read operation, the address decoder 430 may determine one of the plurality of word lines WLs as a selected word line and determine rest of the plurality of word lines WLs except for the selected word line as unselected word lines based on the row address R_ADDR.

The voltage generation circuit 600 may generate word line voltages VWLs, which are used for the operation of the nonvolatile memory device 30 using the power PWR from the memory controller 20 or the power supply voltage VPP, based on the control signals CTLs from control circuit 500. The word line voltages VWLs may be applied to the plurality of word lines WLs through the address decoder 430.

For example, during the erase operation, the voltage generation circuit 600 may apply an erase voltage to a well of the memory block and may apply a ground voltage to entire word lines of the memory block. During the erase verification operation, the voltage generation circuit 600 may apply an erase verification voltage to the entire word lines of the memory block or sequentially apply the erase verification voltage to word lines in a word line basis.

For example, during the program operation, the voltage generation circuit 600 may apply a program voltage to the selected word line and may apply a program pass voltage to the unselected word lines. In addition, during the program verification operation, the voltage generation circuit 600 may apply a program verification voltage to the selected word line and may apply a verification pass voltage to the unselected word lines.

In addition, during the read operation, the voltage generation circuit 600 may apply a read voltage to the selected word line and may apply a read pass voltage to the unselected word lines.

The page buffer circuit 410 may be coupled to the memory cell array 100 through the plurality of bit lines BLs. The page buffer circuit 410 may include a plurality of page buffers. According to at least some example embodiments of the inventive concepts, one page buffer may be connected to one bit line. According to at least some example embodiments of the inventive concepts, one page buffer may be connected to two or more bit lines.

The page buffer circuit 410 may temporarily store data to be programmed in a selected page during the program operation or data read out from the selected page during the read operation. The page buffer circuit 410 may operate in response to a control signal PCTL from the control circuit 500.

The ECC engine 440 may be connected to the page buffer circuit 410, may correct at least one error bit in user data set provided from the memory cell array 100, by using parity data provided from the memory cell array 100 and may provide corrected user data set to the calculation circuit 700.

The calculation circuit 700 may sequentially perform a calculation on information bits and weight bits included in the user data set based on a calculation window having a regular size and may provide output data set to the data input/output circuit 420 when the calculation on all of the information bits and the weight bits is completed. The output data set may correspond to a result of the completed calculation. The calculation circuit 700 may reduce power consumption by providing the output data set to the data input/output circuit 420 when the calculation on all of the information bits and the weight bits is completed instead of providing a result of a window-based calculation whenever the window-based calculation is completed.

The calculation circuit 700 may be controlled in response to a calculation control signal CCTL from the control circuit 500.

The data input/output circuit 420 may be coupled to the calculation circuit 700 through data lines DLs. During the program operation, the data input/output circuit 420 may receive program data DATA from the memory controller 20 and provide the program data DATA to the page buffer circuit 410 through the ECC engine 440 based on the column address C_ADDR received from the control circuit 500.

During the read operation, the data input/output circuit 420 may provide the output data set DATA, provided from the calculation circuit 700, to the memory controller 20 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
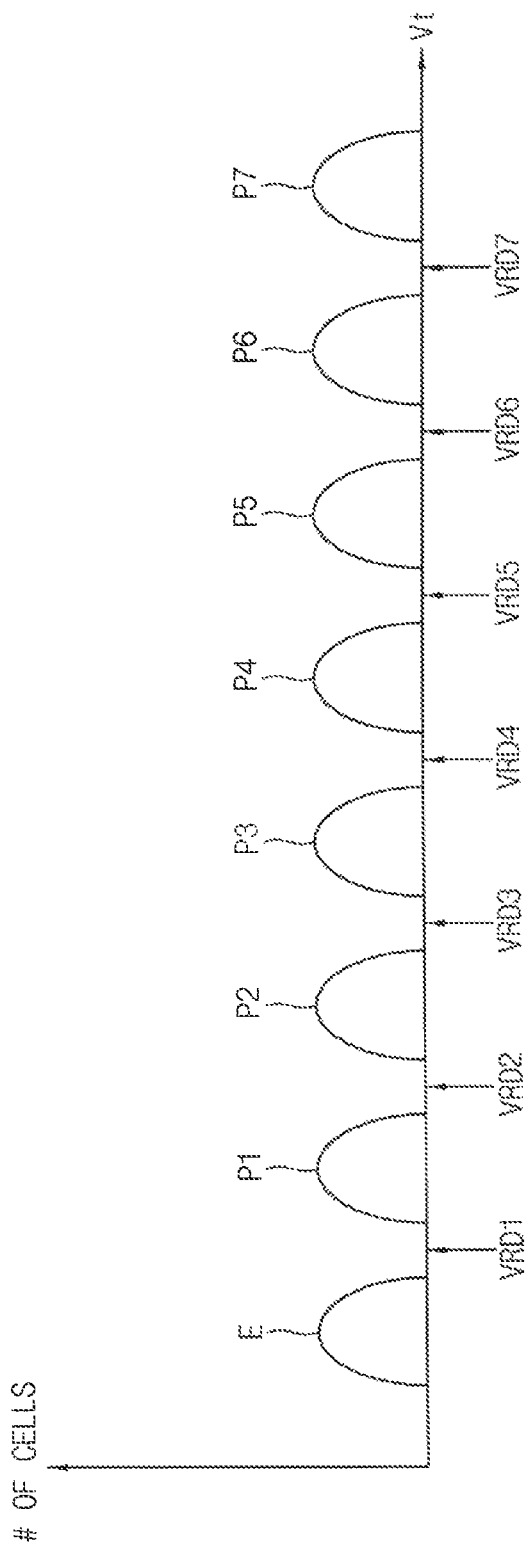
FIG. 7 is a diagram for explaining threshold voltage distributions of one page in the memory cell array in FIG. 3.

FIG. 7 is a diagram for explaining threshold voltage distributions of one page in the memory cell array in FIG. 3.

It is assumed that memory cells of the nonvolatile memory device 30 are triple level cells (TLC) in which each memory cell stores three bits and a read voltage set for determining program states of memory cells includes seven different read voltages.

Referring to FIG. 7, each memory cell of the nonvolatile memory device 30 has one of an erase state E and first through seventh program states P1 through P7. Under a control of the memory controller 20, the nonvolatile memory device 30 determines program states of memory cells using a default read voltage set VRD1 through VRD7 and outputs the determined data states as read data.

According to at least some example embodiments of the inventive concepts, voltage levels of the default read voltage set VRD1 through VRD7 may be predetermined depending on cell characteristics. For example, voltage levels of the default read voltage set VRD1 through VRD7 may be determined depending on threshold voltage distributions of memory cells just after the memory cells are programmed. That is, after the memory cells are programmed, a program verify operation may be performed and threshold voltage distributions of memory cells may be detected. The the default read voltage set VRD1 through VRD7 may be determined based on the detected threshold voltage distributions of memory cells.

Figure 8:
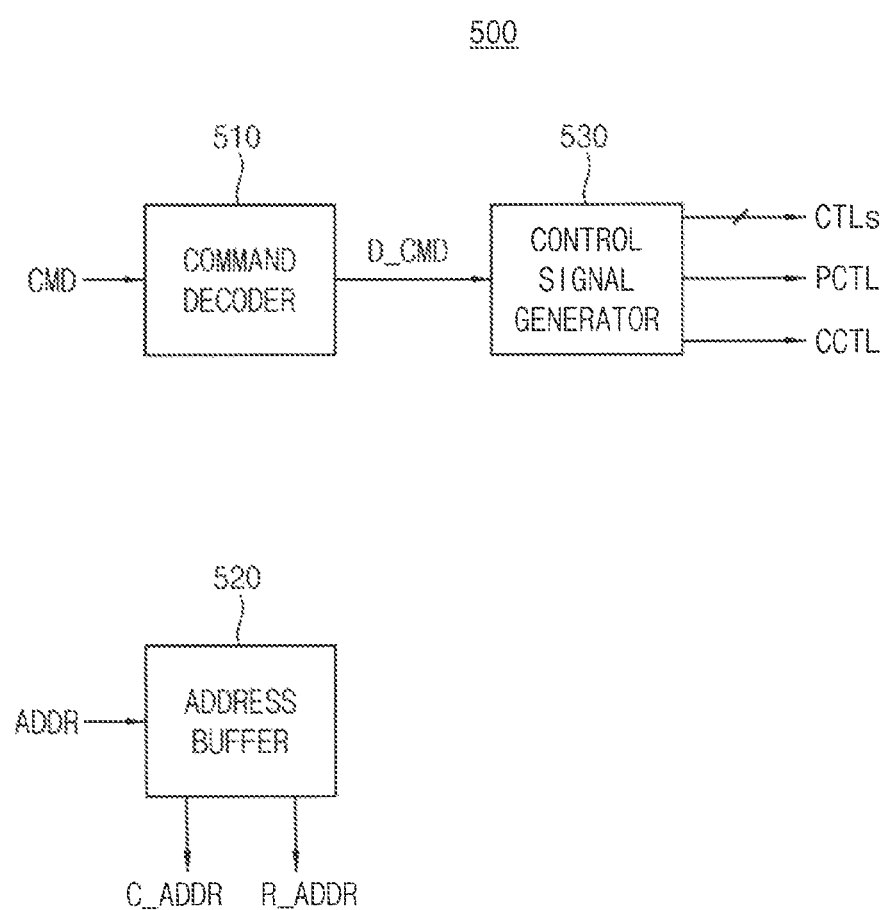
FIG. 8 is a block diagram illustrating the control circuit in the nonvolatile memory device of FIG. 3 according to at least some example embodiments of the inventive concepts.

FIG. 8 is a block diagram illustrating the control circuit in the nonvolatile memory device of FIG. 3 according to at least some example embodiments of the inventive concepts.

Referring to FIG. 8, the control circuit 500 may include a command decoder 510, an address buffer 520, and a control signal generator 530.

The command decoder 510 decodes the command CMD and provides a decoded command D_CMD to the control signal generator 530. The address buffer 520 receives the address signal ADDR, provides the row address R_ADDR to the address decoder 430 and provides the column address C_ADDR to the data input/output circuit 420.

The control signal generator 530 receives the decoded command D_CMD, generates the control signals CTLs based on an operation directed by the decoded command D_CMD and provides the control signals CTLs to the voltage generation circuit 600. The control signal generator 530 may provide the control signal PCTL to the page buffer circuit 410. The control signal generator 530 may provide the calculation control signal CCTL to the calculation circuit 700.

Figure 9:
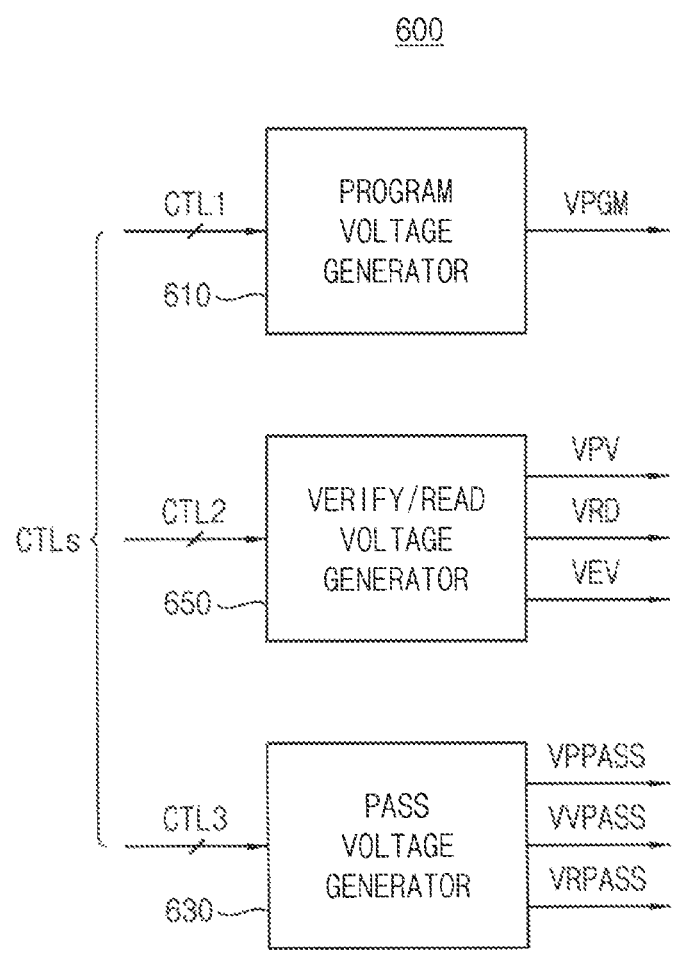
FIG. 9 is a block diagram illustrating the voltage generation circuit in the nonvolatile memory device of FIG. 3 according to at least some example embodiments of the inventive concepts.

FIG. 9 is a block diagram illustrating the voltage generation circuit in the nonvolatile memory device of FIG. 3 according to at least some example embodiments of the inventive concepts.

Referring to FIG. 9, the voltage generation circuit 600 includes a program voltage generator 610, a verify/read voltage generator 650 and a pass voltage generator 630.

The program voltage generator 610 may generate a program voltage VPGM according to an operation designated by the decoded command D_CMD, in response to a first control signal CTL1. The program voltage VPGM may be provided to the selected word line. The first control signal CTL1 may include a plurality of bits which indicate the operation directed by the decoded command D_CMD.

The verify/read voltage generator 650 may generate a program verify voltage VPV, a read verify voltage VRD and an erase verify voltage VEV according to operations designated by the decoded command D_CMD, in response to a second control signal CTL2. The program verify voltage VPV, the read verify voltage VRD and the erase verify voltage VEV may be applied to the selected word line according to the operations. The second control signal CTL2 may include a plurality of bits which indicate the operations directed by the decoded command D_CMD.

The pass voltage generator 630 may generate a program pass voltage VPPASS, a verify pass voltage VVPASS and a read pass voltage VRPASS according to operations designated by the decoded command D_CMD, in response to a third control signal CTL3. The program pass voltage VPPASS, the verify pass voltage VVPASS and the read pass voltage VRPASS may be applied to the unselected word lines according to the operations. The third control signal CTL3 may include a plurality of bits which indicate the operations directed by the decoded command D_CMD.

Figure 10:
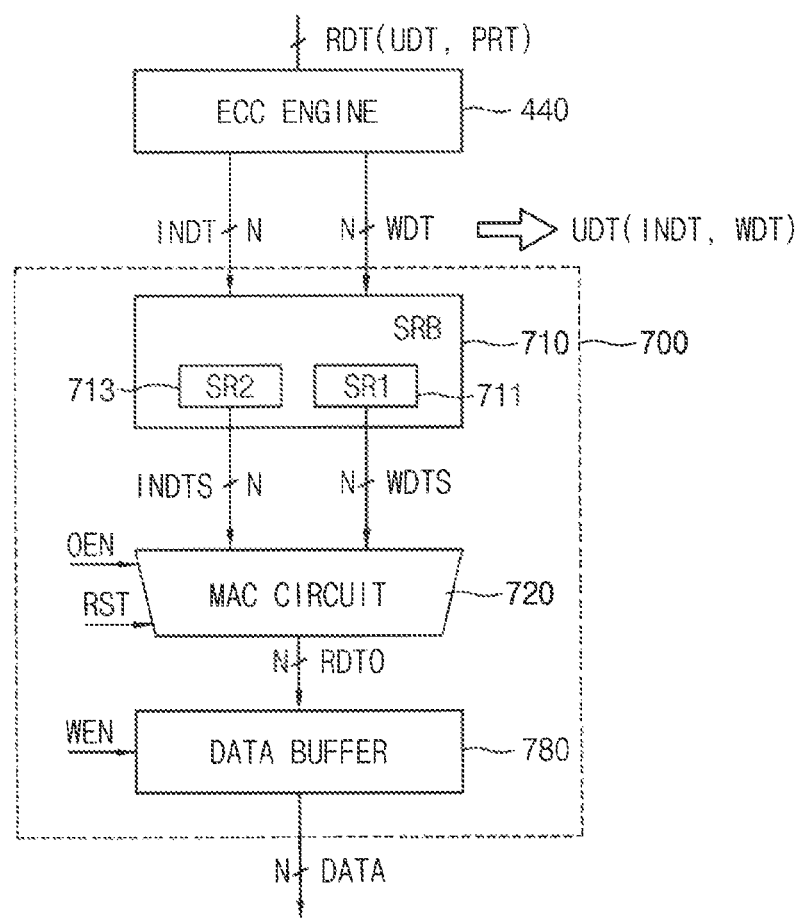
FIG. 10 is a block diagram illustrating the calculation circuit in the nonvolatile memory device of FIG. 3 according to at least some example embodiments of the inventive concepts.

FIG. 10 is a block diagram illustrating the calculation circuit in the nonvolatile memory device of FIG. 3 according to at least some example embodiments of the inventive concepts.

In FIG. 10, the ECC engine 440 is illustrated with the calculation circuit 700 for convenience of description.

Referring to FIG. 10, the calculation circuit 700 may include a shift register block 710, a multiplication and accumulation (MAC) circuit 720 and a data buffer 780. The shift register block 710 may include a first shift register 711 and a second shift register 713.

The ECC engine 440 may correct at least one error bit in user data set UDT in a read data set RDT, by using parity data PRT in the read data set RDT provided from the page buffer circuit 410. The ECC engine 440 may provide the shift register block 710 with information bits INDT and weight bits WDT included in the user data set UDR. For example, the ECC engine 440 may correct at least one error in the information bits INDT and weight bits WDT based on the parity data PRT. The weight bits WDT are associated with the information bits INDT. Each of the information bits INDT and the weight bits WDT may include N bits and N is an integer greater than one. When the user data set UDT corresponds to image data, the information bits INDT may include pixel values of the image data and the weight bits WDT may include parameter values associated with the pixel values.

The shift register block 710 may divide the weight bits WDT based on a calculation window to provide feature maps sequentially, and may divide the information bits INDT based on correlation between each of the feature maps and the information bits INDT to provide activations sequentially. Here, the calculation window may define a size of a subset of the weight bits WDT in a matrix configuration and, each of the feature maps may be obtained by applying sequentially the calculation window to the weight bits WDT. The information bits INDT may be grouped into the activations based on the correlation between each of the feature maps and the information bits INDT. For example, each activation may be associated with elements in a corresponding feature map of the feature maps.

The first shift register 711 may arrange the weight bits WDT into the feature maps, each having P*Q matrix configuration, may shift the weight bits WDT such that the feature maps are output based on a first calculation window sequentially and may output first shifted bits WDTS. Here, P and Q are natural numbers. The second shift register 713 may arrange the information bits INDT into the activations corresponding to a plurality of sub data sets, each having L*L matrix configuration, based on the correlation, may shift the information bits INDT such that the activations are output based on a second calculation window having P*Q matrix configuration, sequentially and may output second shifted bits INDTS. Here, L is a natural number greater than three and greater than P and Q.

The MAC circuit 720 may receive the first shifted bits WDTS and the second shifted bits INDTS, may perform matrix-vector multiplication on each of the feature maps and the corresponding activations, may accumulate a result of the matrix-vector multiplication and may provide the output data set RDTO to the data buffer 780, in response to an output enable signal OEN, when the matrix-vector multiplication on all of the feature maps and the activations is completed.

The data buffer 780 may store the output data set RDTO therein in response to a write enable signal WEN. The data buffer 780 may include a static random access memory (SRAM) device. The data buffer 780 may provide the memory controller 20 with the stored output data set RDTO as the data DATA.

Figure 11:
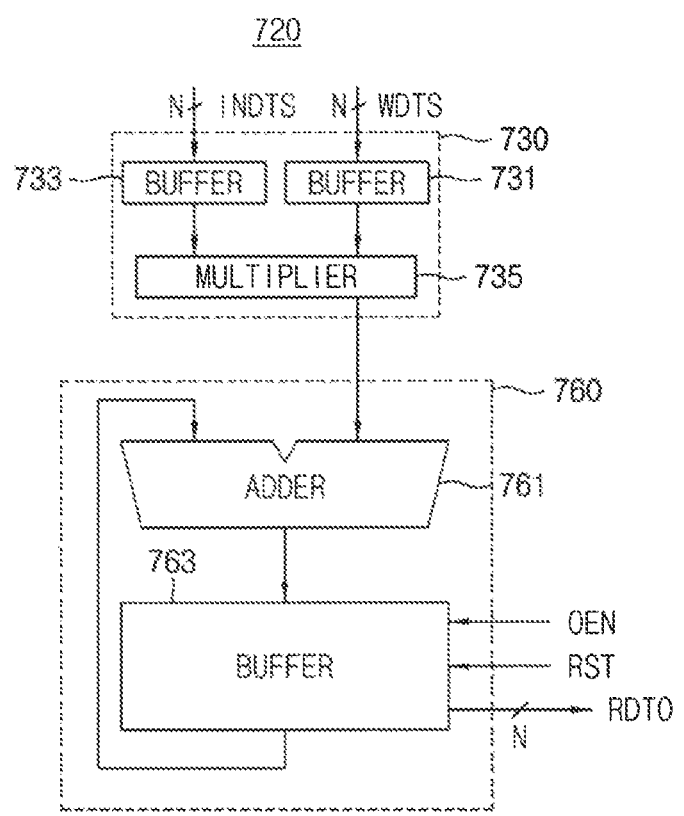
FIG. 11 is a block diagram illustrating an example of the multiplication and accumulation (MAC) circuit in the calculation circuit in FIG. 10 according to at least some example embodiments of the inventive concepts.

FIG. 11 is a block diagram illustrating an example of the multiplication and accumulation (MAC) circuit in the calculation circuit in FIG. 10 according to at least some example embodiments of the inventive concepts.

Referring to FIG. 11, the MAC circuit 720 may include a multiplication circuit 730 and an accumulation circuit 760.

The multiplication circuit 730 may receive the first shifted bits WDTS and the second shifted bits INDTS and may multiply information bits in one of the activations by weight bits in correspond one of the feature maps to provide a multiplied result as an output. The accumulation circuit 760 may accumulate the output of the multiplication circuit 730 to provide the output data set RDTO.

The multiplication circuit 730 may include a first buffer 731, a second buffer 733 and a multiplier 735. The first buffer 731 may receive the first shifted bits WDTS to output the first shifted bits WDTS as the feature maps on a first calculation window basis. The second buffer 733 may receive the second shifted bits INDTS to output the second shifted bits INDTS as the activations on a second calculation window basis. The multiplier 735 may multiply an output of the first buffer 731 by an output of the second buffer 733 to provide a multiplied result as an intermediate calculation result ICR.

The accumulation circuit 760 may include an adder 761 and a buffer 763. The adder 761 may have a first input terminal and a second input terminal, and may receive the intermediate calculation result ICR, i.e., the output of the multiplier 735. The adder 761 may add the intermediate calculation result ICR from the multiplication circuit with an output of the buffer 763, received at the second input terminal, to provide an added result to the buffer 763. The buffer 763 may feed-back the output of the adder 761 to the second input terminal of the adder 761. The buffer 763 may provide the output of the adder 761 as the output data set RDTO in response to an output enable signal OEN and may be reset in response to a reset signal RST. The output enable signal OEN and the reset signal RST may be included in the calculation control signal CCTL.

Since the buffer 763 hold the output of the adder 761 until the multiplication circuit 730 completes the vector-matrix multiplication on all of the activations and the feature maps associated with each output sub data set of the output data set RDTO, the nonvolatile memory device 30 may reduce power consumed by an input/output circuit.

Figure 12:
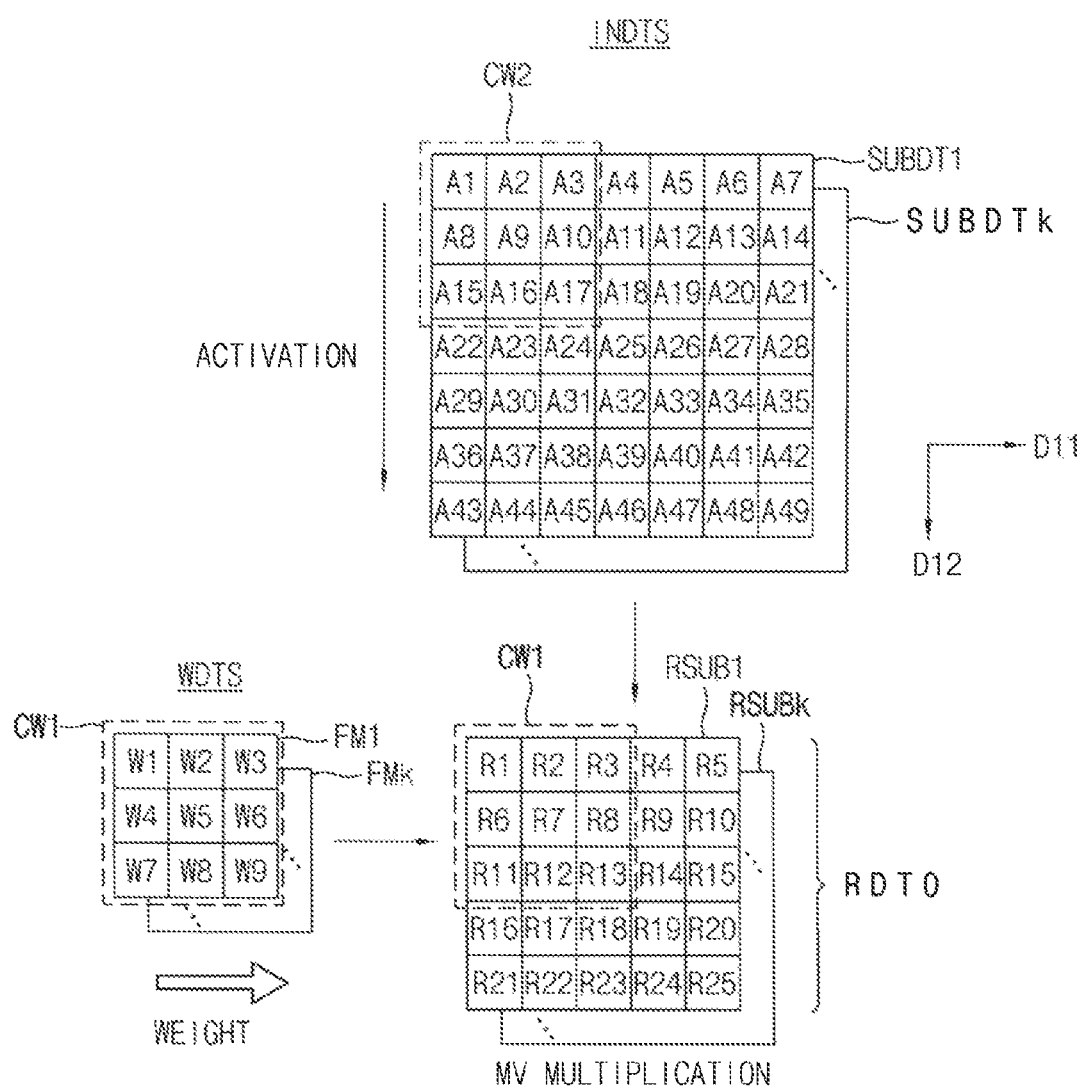
FIG. 12 illustrates a matrix calculation performed by the calculation circuit in FIG. 10
Figure 13:
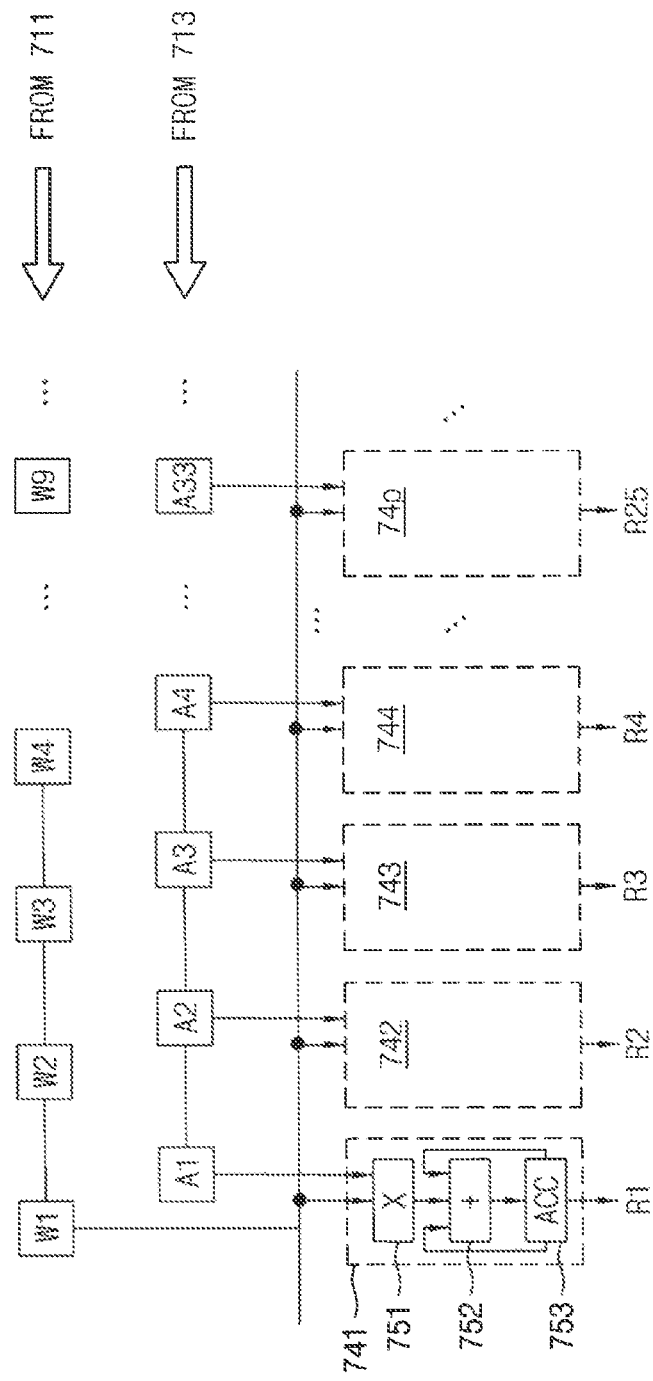
FIG. 13 illustrates the matrix calculation in FIG. 12 in detail.

FIG. 12 illustrates a matrix calculation performed by the calculation circuit in FIG. 10 and FIG. 13 illustrates the matrix calculation in FIG. 12 in detail.

Referring to FIG. 12, the first shifted bits WDTS associated with the weight bits WDT may be arranged into feature maps FM1~FMk by applying a first calculation window CW1 to the first shifted bits WDTS and each of the feature maps FM1~FMk may correspond to the first calculation window CW1. Each of the feature maps FM1~FMk may have P*Q matrix configuration. In FIG. 12, it is assumed that P and Q are each equal to 3.

A first feature map FM1 may have weight bits W1~W9 as its element with a 3*3 matrix configuration. The second shifted bits INDTS associated with the information bits INDT may be arrange into a plurality of sub data sets SUBDT1~SUBDTk based on correlation between each of the feature maps FM1~FMk and the information bits INDT. That is, the second shifted bits INDTS may be grouped into the plurality of sub data sets SUBDT1~SUBDTk depending on correlation with each of the feature maps FM1~FMk. For example, the sub data set SUBDT1 of the second shifted bits INDTS is related to the feature map FM1 and the sub data set SUBDTk of the second shifted bits INDTS is related to the feature map FMk. Each of the sub data sets SUBDT1~SUBDTk may correspond to the activation. Each of the sub data sets SUBDT1~SUBDTk may have L*L matrix configuration. In FIG. 12, it is assumed that L is equal to 7. A first sub data set SUBDT1, i.e., a first activation may have information bits A1~A49 as its element with 7*7 matrix configuration. In FIG. 12, a second calculation window CW2 having a same size as the first calculation window CW1 is illustrated on the sub data set SUBDT1.

The calculation circuit 700 may perform a matrix-vector multiplication on each of the feature maps FM1~FMk and each of the activations corresponding to the sub data sets SUBDT1~SUBDTk to provide output sub data sets RSUB1~RSUBk.

A first output sub data set RSUB1 may be generated by a matrix-vector multiplication on the first feature map FM1 and the first activation, i.e., the first sub data set SUBDT1.

FIG. 13 illustrates a process of a matrix-vector multiplication on the first feature map and the first activation in FIG. 12.

Referring to FIG. 13, the MAC circuit 720 may include a plurality of unit calculators 741~74p. The unit calculator 741 may include a multiplier 751, an adder 752 and an accumulator 753. The adder 752 may have a first input terminal to receive an output of the multiplier 751 and a second input terminal to receive an output of the accumulator 753. Therefore, a first element R1 of the first output sub data set RSUB1 may be calculated according to equation 1 below.

$$R1=A1*W1+A2*W2+A3*W3+A8*W4+A9*W5+A10*W6+\ldots+A17*W9 \quad \text{[Equation 1]}$$

Similarly, an element R25 of the first output sub data set RSUB1 may be calculated according to equation 2 below.

$$R25=A33*W1+A34*W2+A35*W3+A40*W4+A41*W5+A42*W6+\ldots+A49*W9 \quad \text{[Equation 2]}$$

The unit calculator 741 generates the element R1 using equation 1, the unit calculator 742 generates the element R2, the unit calculator 743 generates the element R3, and the unit calculator 74p generates the element R25.

When the second shift register 713 shifts the second calculation window CW2 (when the second calculation window CW2 includes P*P information bits in a first direction D11 and a second direction D12) in FIG. 12, the second shift register 713 may shift the second calculation window CW2 in the first direction D11 such that 2P information bits in the second direction D12 are repeatedly selected with respect to two consecutive positions of the second calculation window CW2 until the second calculation window CW2 reaches a boundary of the activations and shift the second calculation window CW2 by L-P in response to the second calculation window CW2 reaching the boundary of the activations.

The nonvolatile memory device 30 may include a plurality of calculation circuits such as the calculation circuit 700 and the plurality of calculation circuits may perform the matrix-vector multiplication on each of the feature maps FM1~FMk and each of the activations corresponding to the sub data sets SUBDT1~SUBDTk in parallel.

Figure 14:
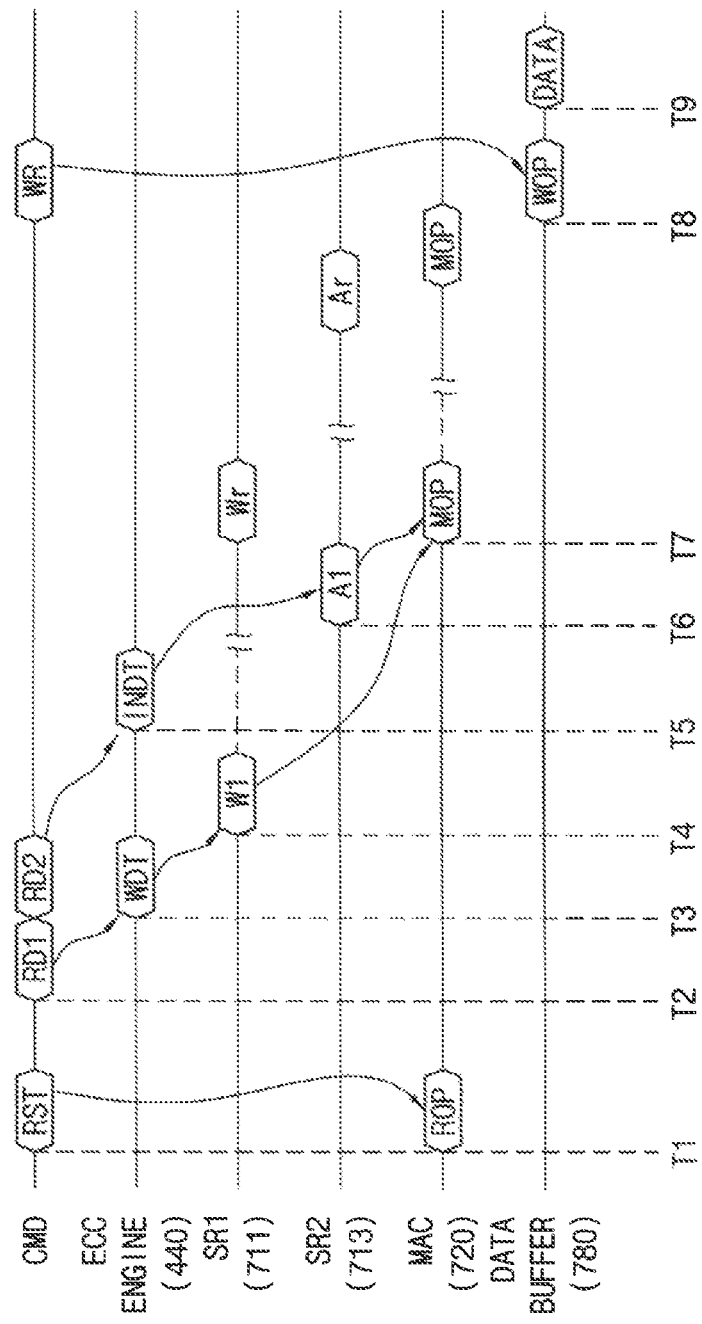
FIG. 14 is a timing diagram illustrating operation of the nonvolatile memory device according to at least some example embodiments of the inventive concepts.

FIG. 14 is a timing diagram illustrating operation of the nonvolatile memory device according to at least some example embodiments of the inventive concepts.

In FIG. 14, operation of the ECC engine 440 and the calculation circuit 700 are described mainly.

Referring to FIGS. 1 through 14, at a timing point T1, the buffer 763 in the accumulation circuit 760 is reset in response to the reset signal RST corresponding to a reset command (ROP). The buffer 763 is set to a state in which data is not stored in the buffer 763. At a timing point T2, the weight bits WDT are provided to the ECC engine 440 through the page buffer circuit 410 in response to a first read command RD1, and at a timing point T3, the information bits INDT are provided to the ECC engine 440 through the page buffer circuit 410 in response to a second read command RD2. The ECC engine 440 may perform an ECC decoding on the weight bits WDT and the information bits INDT to correct at least one error bits in the weight bits WDT and the information bits INDT.

From a timing point T4, the first shift register 711 sequentially outputs weights W1~Wr in the weight bits WDT and from a timing point T6, the second shift register 713 sequentially outputs bits A1~Ar in the information bits INDT. From a timing point T7 to a timing point T8, the MAC circuit 720 performs matrix-vector multiplication MOP on the weights W1~Wr and the bits A1~Ar, at the timing point T8, the data buffer 780 stores a result of the matrix-vector multiplication MOP on the weights W1~Wr and the bits A1~Ar therein in response to a write command and the data buffer 780 outputs the data DATA.

Therefore, since the buffer 763 does not provide the data buffer 780 with the output of the adder 761 until the multiplication circuit 730 completes the matrix-vector multiplication on all of information bits and the weight bits on a calculation window basis in the calculation circuit 700 in the nonvolatile memory device 30, the nonvolatile memory device 30 may reduce power consumed by an input/output circuit. Accordingly, the nonvolatile memory device 30 may reduce data processing time and a power consumption of multilayer perceptron (MLP), recurrent neural network (RNN), convolution neural network (CNN), etc.

Figure 15:
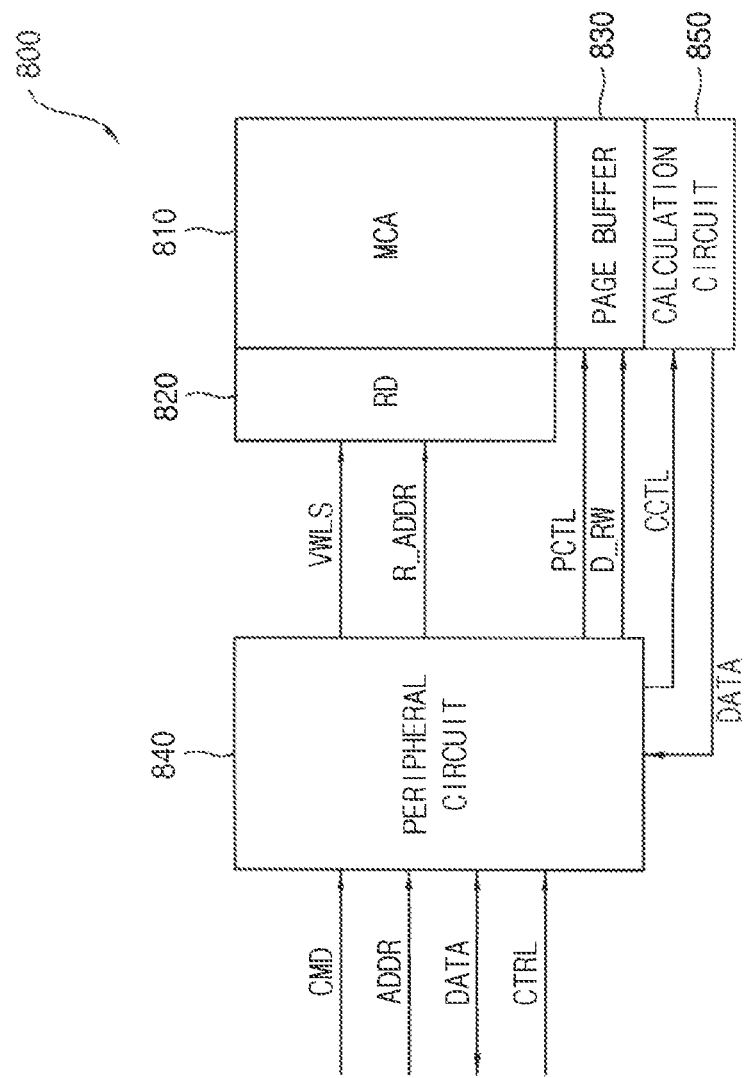
FIG. 15 is a block diagram illustrating a nonvolatile memory device according to at least some example embodiments of the inventive concepts.

FIG. 15 is a block diagram illustrating a nonvolatile memory device according to at least some example embodiments of the inventive concepts.

Referring to FIG. 15, a nonvolatile memory device 800 may include a memory cell array 810, a row decoder 820, a page buffer circuit 830, a calculation circuit 850 and a peripheral circuit 840.

The row decoder 820 may receive driving voltages VWLS and a row address R_ADDR. As a degree of integration of the memory cell array 810 and an operating speed of the nonvolatile memory device 800 increase, due to a delay in a signal applied to the word line, the row decoder 820 may not only be disposed adjacent to the memory cell array 810, but also include identical circuits repeatedly arranged adjacent to the respective word lines arranged in the memory cell array 810.

The peripheral circuit 840 may receive a control signal PCTL from the peripheral circuit 840 and may receive a data signal D_RW from the peripheral circuit 840. The peripheral circuit 840, in response to the control signal PCTL may apply a signal to a bit line based on the data signal D_RW received from the peripheral circuit 840 and thus write data to the memory cell of the memory cell array 810.

The calculation circuit 850 may perform calculation on user data set provided from the peripheral circuit 840 in response to a calculation control signal CCTL from the peripheral circuit 840 and may provide output data set DATA to the peripheral circuit 840. The peripheral circuit 840 may receive a command CMD, an address ADDR, and a control signal CTRL from an outside of the nonvolatile memory device 800, and may transceive (i.e., receive and/or transmit) data DATA with the outside of the nonvolatile memory device 800.

Figure 16:
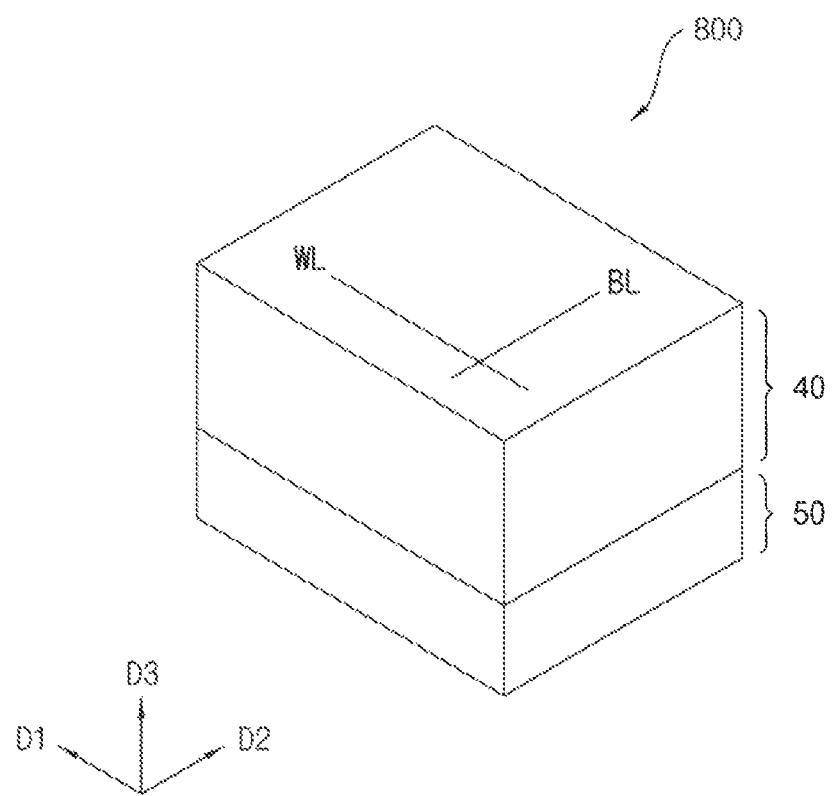
FIG. 16 schematically illustrates a structure of the nonvolatile memory device of FIG. 15 according to at least some example embodiments of the inventive concepts.

FIG. 16 schematically illustrates a structure of the nonvolatile memory device of FIG. 15 according to at least some example embodiments of the inventive concepts.

Referring to FIG. 16, the nonvolatile memory device 800 may include may include a first semiconductor layer 40 and a second semiconductor layer 50, and the first semiconductor layer 40 may be stacked on the second semiconductor layer 50 in a third direction D3. The memory cell array 810 in FIG. 15 may be formed in the first semiconductor layer 40, and the row decoder 820, the page buffer circuit 830, the calculation circuit 850 and the peripheral circuit 840 may be formed in the second semiconductor layer 50. In other words, the second semiconductor layer 50 may include a substrate, and semiconductor devices such as transistors and a pattern for wiring devices are formed on the substrate. Accordingly, circuits, for example, circuits corresponding to the row decoder 820, the page buffer circuit 830, the calculation circuit 850 and the peripheral circuit 840 may be formed in the second semiconductor layer 50.

After the circuits are formed in the second semiconductor layer 50, the first semiconductor layer 40 including the memory cell array 810 may be formed, and patterns for electrically connecting the memory cell array 810 (e.g. the word lines WL and the bit lines BL) and the circuits (e.g. the circuits corresponding to the row decoder 820, the page buffer circuit 830, the calculation circuit 850 and the peripheral circuit 840) formed in the second semiconductor layer 50 may be formed. Accordingly, the nonvolatile memory device 800 may have a structure, that is, a Cell-On-Peri or Cell-Over-Peri (COP) structure, in which the memory cell array 810 and other circuits, that is, the circuits corresponding to the row decoder 820, the page buffer circuit 830, the calculation circuit 850 and the peripheral circuit 840 are disposed in a stacking direction, that is, the third direction D3. As the circuits, except for the memory cell array 810, are disposed under the memory cell array 810, the COP structure may effectively decrease an area occupying on a surface perpendicular to the stacking direction.

As illustrated in FIG. 16, in the first semiconductor layer 40 where the memory cell array 810 is formed, the word lines WL may extend in the first direction D1 perpendicular to the stacking direction, that is, the third direction D3, and the bit lines BL may extend in the second direction D2 perpendicular to the stacking direction, that is, the third direction D3.

Some circuits included in the peripheral circuit 840 may be formed in the second semiconductor layer 50 without overlapping the memory cell array 810. As a result, an area of the nonvolatile memory device 800, that is, a planar area perpendicular to the third direction D3, may be increased, a degree of integration of the nonvolatile memory device 800 may be improved.

Figure 17:
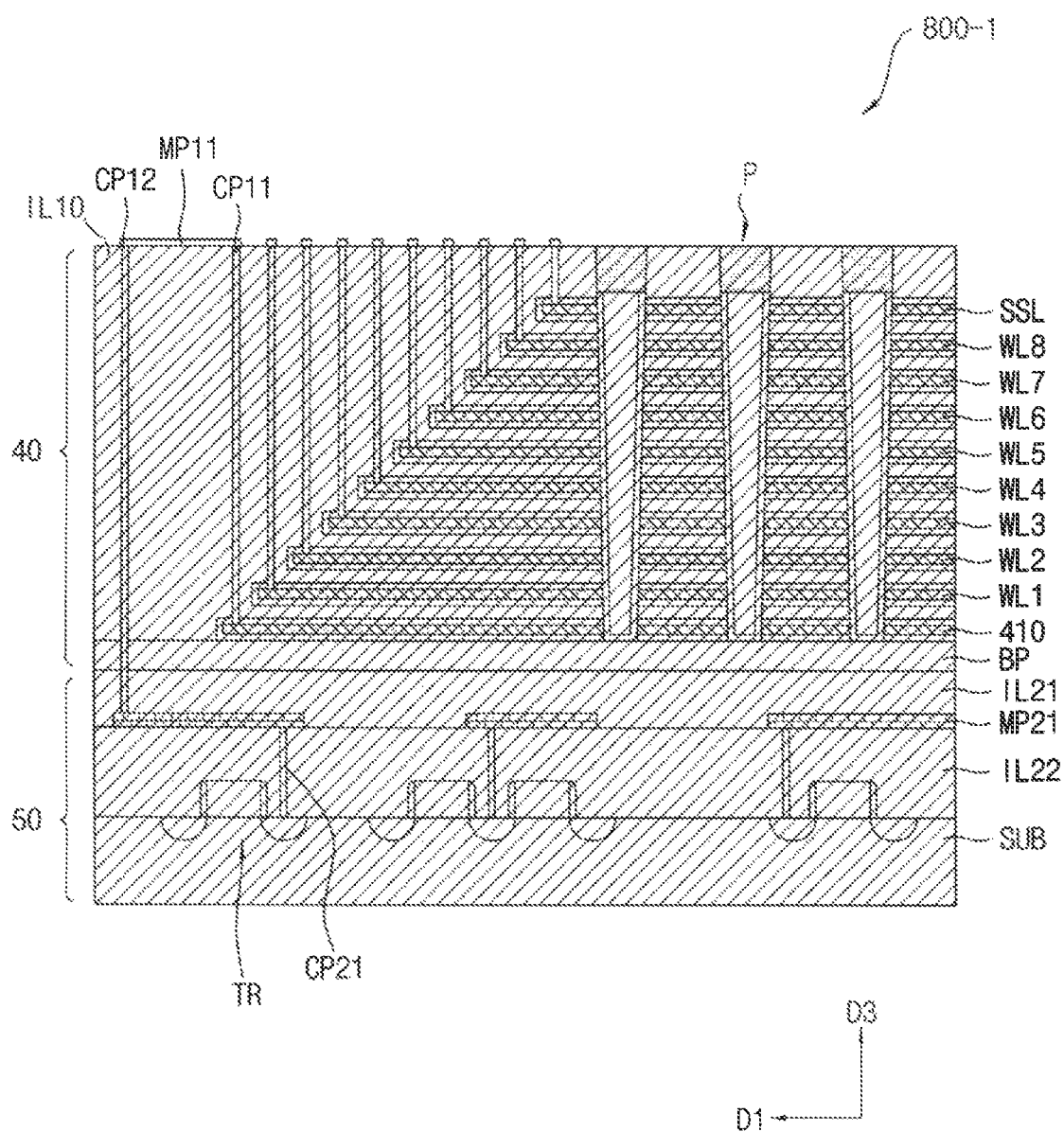
FIG. 17 is cross-sectional view of an example of the nonvolatile memory device according to at least some example embodiments of the inventive concepts.

FIG. 17 is cross-sectional view of an example of the nonvolatile memory device according to at least some example embodiments of the inventive concepts.

Referring to FIG. 17, the second semiconductor layer 50 may include the substrate SUB, a second lower insulating layer IL22, and a first lower insulating layer IL21, which are stacked in the third direction D3.

A plurality of semiconductor devices, for example, transistors TR, may be formed on the substrate SUB of the second semiconductor layer 50. The semiconductor device may be electrically connected to a conductive pattern MP21 formed on the first lower insulating layer IL21 via a contact plug CP21 penetrating through the second lower insulating layer IL22. The semiconductor device formed in the second semiconductor layer 50 may form circuits corresponding to the row decoder 820, the page buffer circuit 830, the calculation circuit 850 and the peripheral circuit 840 in FIG. 15.

The first semiconductor layer 40 is formed may be stacked in the second semiconductor layer 50, and may include the base plate BP and an upper insulating layer IL10, which are stacked in the third direction D3.

A conductive path may be formed between the first semiconductor layer 40 and the second semiconductor layer 50 through a contact plug CP12 disposed at an edge side of the memory cell array 810. In other words, as illustrated in FIG. 17, a string selection lines SSL, word lines WL1 to WL8, and a ground selection line GSL, which are stacked in the third direction D3, may be electrically connected to a conductive pattern MP11 formed on an upper surface of the first semiconductor layer 40 through a contact plug CP11 formed in the upper insulating layer IL10. The conductive pattern MP11 may be electrically connected to the conductive pattern MP21 formed in the second semiconductor layer 50 through the contact plug CP12 penetrating through the first semiconductor layer 10, that is, the upper insulating layer IL10 and the base plate BP. As a result, the conductive pattern MP11 may be electrically connected to the semiconductor device, for example, a transistor TR, formed in the second semiconductor layer 50.

For example, the contact plug CP12 disposed at the edge side of the memory cell array 810 and penetrating through the first semiconductor layer 40 may be used to electrically connect the word lines WL1-WL8 arranged in the memory cell array 810 to the circuit corresponding to the row decoder 820 formed in the second semiconductor layer 50.

Figure 19:
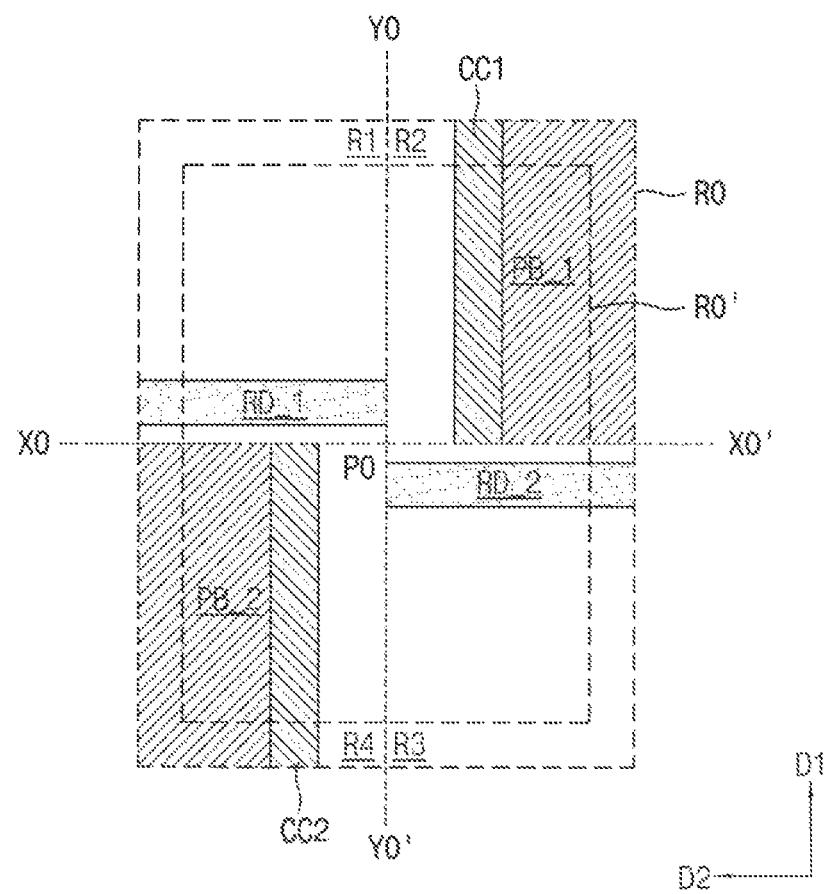
FIG. 19 is a plan view of an upper surface of the second semiconductor layer contacting the first semiconductor layer in the nonvolatile memory device of FIG. 18.

FIG. 18 illustrates a structure of a nonvolatile memory device including first and second semiconductor layers according to at least some example embodiments of the inventive concepts and FIG. 19 is a plan view of an upper surface of the second semiconductor layer contacting the first semiconductor layer in the nonvolatile memory device of FIG. 18.

Referring to FIGS. 18 and 19, in a nonvolatile memory device 800', the row decoder 820 may be disposed to have a shape extending in a direction perpendicular to a direction in which the word lines WL extend, that is, in a direction in which the word lines WL are arranged. The page buffer circuit 830 may be disposed to have a shape extending in a direction perpendicular to the bit lines BL, that is, in a direction in which the bit lines BL are arranged. Accordingly, in the nonvolatile memory device 800' having a COP structure, the row decoder 820, the page buffer circuit 830 and the calculation circuit 850 may be disposed like a windmill as each of the row decoder 820 and the page buffer circuit 830 is separated into two or more parts as illustrated in FIGS. 18 and 19, to increase an area overlapping the memory cell array 810 of the first semiconductor layer 40 in the third direction D1.

In other words, referring to FIGS. 18 and 19, the circuit corresponding to the row decoder 820 may be separated into first and second row decoder circuits RD_1 and RD_2, the circuit corresponding to the page buffer circuit 830 may be separated into first and second page buffer circuits PB_1 and PB_2, and the circuit corresponding to calculation circuit 850 may be separated into first and second calculation circuits CC1 and CC2. For example, when the circuit corresponding to the row decoder 120 has substantially the same length as the memory cell array 110 in the second direction and the circuit corresponding to the page buffer 130 has substantially the same length as the memory cell array 110 in the first direction, the circuits corresponding to the row decoder 120 and the page buffer 130 may be disposed like a windmill to overlap the memory cell array 110 of the first semiconductor layer 10 in the third direction. The circuits corresponding to the row decoder 820, the page buffer circuit 830 and the calculation circuit 850 may be disposed like a windmill to overlap the memory cell array 810 of the first semiconductor layer 40 in the third direction D3.

Referring to FIG. 19, when an virtual line Y0-Y0' in the first direction D1 parallel to the word line WL, and an virtual line X0-X0' in the second direction D2 parallel to the bit line BL intersect at a point P0 in a region R0 or R0' overlapping the memory cell array 810 in the third direction D3 perpendicular to the first and second directions D1 and D2, the second semiconductor layer 50 may include four regions R1 to R4 sectioned by the two virtual lines Y0-Y0' and X0-X0'. As illustrated in FIG. 19, the first and second row decoder circuits RD_1 and RD_2 may be disposed in the first and third regions R1 and R3, respectively, the first and second page buffer circuits PB_1 and PB_2 may be disposed in the second and fourth regions R2 and R4, respectively and the first and second calculation circuits CC1 and CC2 may be disposed in the second and fourth regions R2 and R4, respectively.

For example, if a region of the second semiconductor layer 50 overlapping the memory cell array 810 of the first semiconductor layer 40 is the region R0 of FIG. 19, the first to fourth regions R1 to R4 may completely overlap the memory cell array 810. Accordingly, the first and second row decoder circuits RD_1 and RD_2, the first and second page buffer circuits PB_1 and PB_2 and the first and second calculation circuits CC1 and CC2 may be completely overlapped with the memory cell array 810 in the third direction D3. In another example, if a region of the second semiconductor layer 50 overlapping the memory cell array 810 of the first semiconductor layer 40 is the region R0' of FIG. 19, the first to fourth regions R1 to R4 may partially overlap the memory cell array 810. Accordingly, the first and second row decoder circuits RD_1 and RD_2, the first and second page buffer circuits PB_1 and PB_2 and the first and second calculation circuits CC1 and CC2 may include a portion that does not overlap the memory cell array 810 in the third direction D3.

Figure 20:
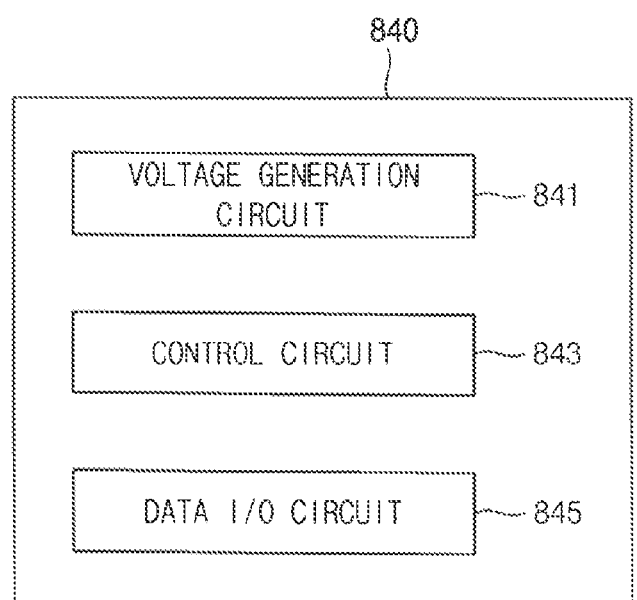
FIG. 20 is a block diagram of an example of the peripheral circuit in the nonvolatile memory device of FIG. 15 according to at least some example embodiments of the inventive concepts.

FIG. 20 is a block diagram of an example of the peripheral circuit in the nonvolatile memory device of FIG. 15 according to at least some example embodiments of the inventive concepts.

Referring to FIG. 20, the peripheral circuit 840 may include a voltage generation circuit 841, a control circuit 843 and a data input/output circuit 845. Configuration and operation of each of the voltage generation circuit 841, the control circuit 843 and the data input/output circuit 845 are substantially the same as configuration and operation of each of the voltage generation circuit 600, the control circuit 500 and the data input/output circuit 420 in the nonvolatile memory device 30 of FIG. 3, and thus detailed description will be omitted.

The circuits corresponding to the elements of the peripheral circuit 840 of FIG. 20 may be disposed in the second semiconductor layer 50 in FIG. 16 with the row decoder 820 the page buffer circuit 830 and the calculation circuit 850 in FIG. 15.

Figure 21:
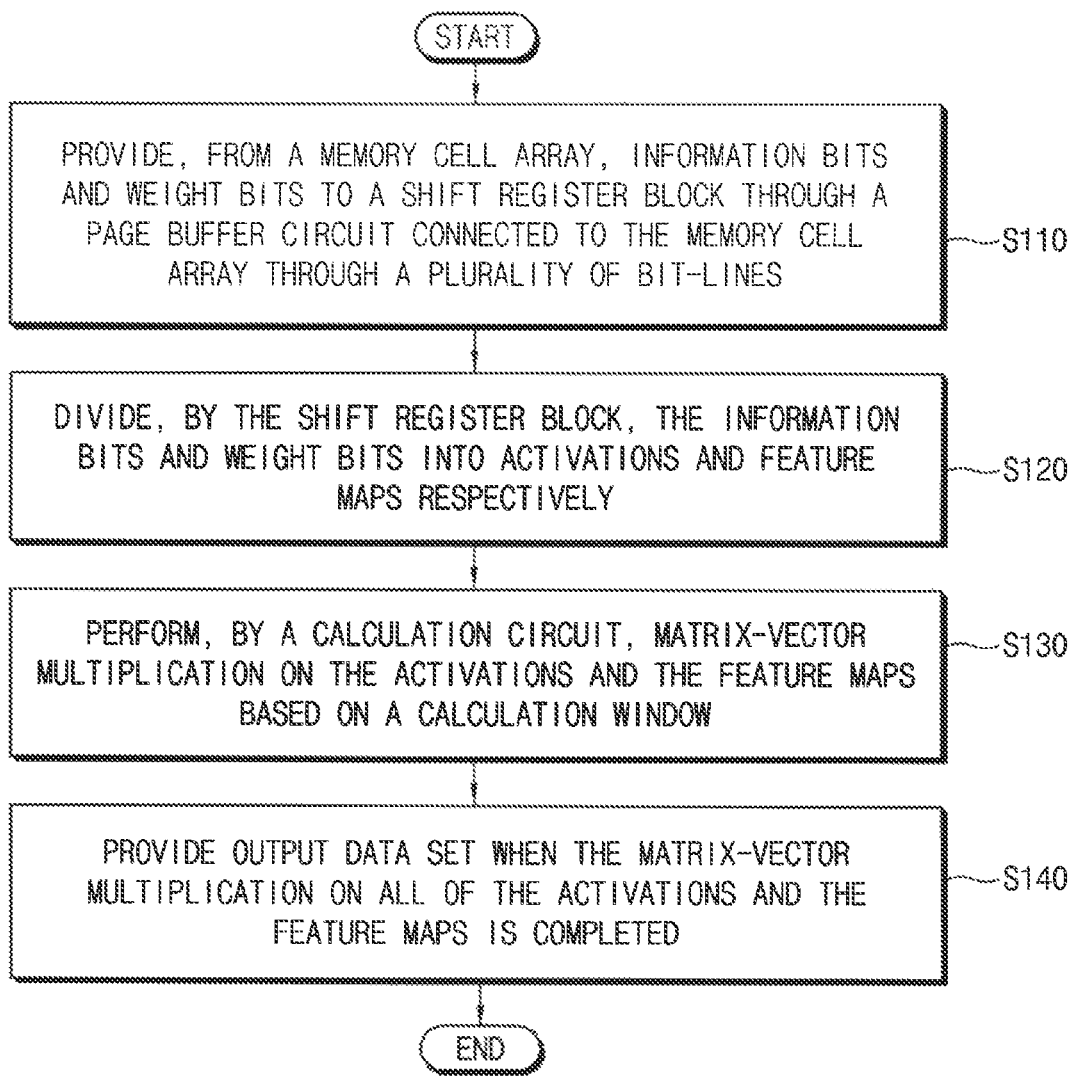
FIG. 21 is a flow chart illustrating a method of operating a nonvolatile memory device according to at least some example embodiments of the inventive concepts.

FIG. 21 is a flow chart illustrating a method of operating a nonvolatile memory device according to at least some example embodiments of the inventive concepts.

Referring to FIGS. 1 through 20, in a method of operating a nonvolatile memory device 30 that includes a memory cell array 100 having a plurality of nonvolatile memory cells, information bits INDT and weight bits WDT from the memory cell array 100 are provided to a shift register block 710 through a page buffer circuit 410 connected to the memory cell array 100 through a plurality of bit lines BLs (S110). The information bits INDT and the weight bits WDT are included in user data set UDT read through the page buffer circuit 410. The information bits INDT and the weight bits WDT are, in the shift register block 710, divided into activations and feature maps respectively (S120).

A MAC circuit 720 performs matrix-vector multiplication on the activations and the feature maps based on a calculation window (S130). A data buffer 780 provides output data set RDTO when the matrix-vector multiplication on all of the information bits and the weight bits is completed (S140). The output data set RDTO corresponds to a result of the completed matrix-vector multiplication.

Figure 22:
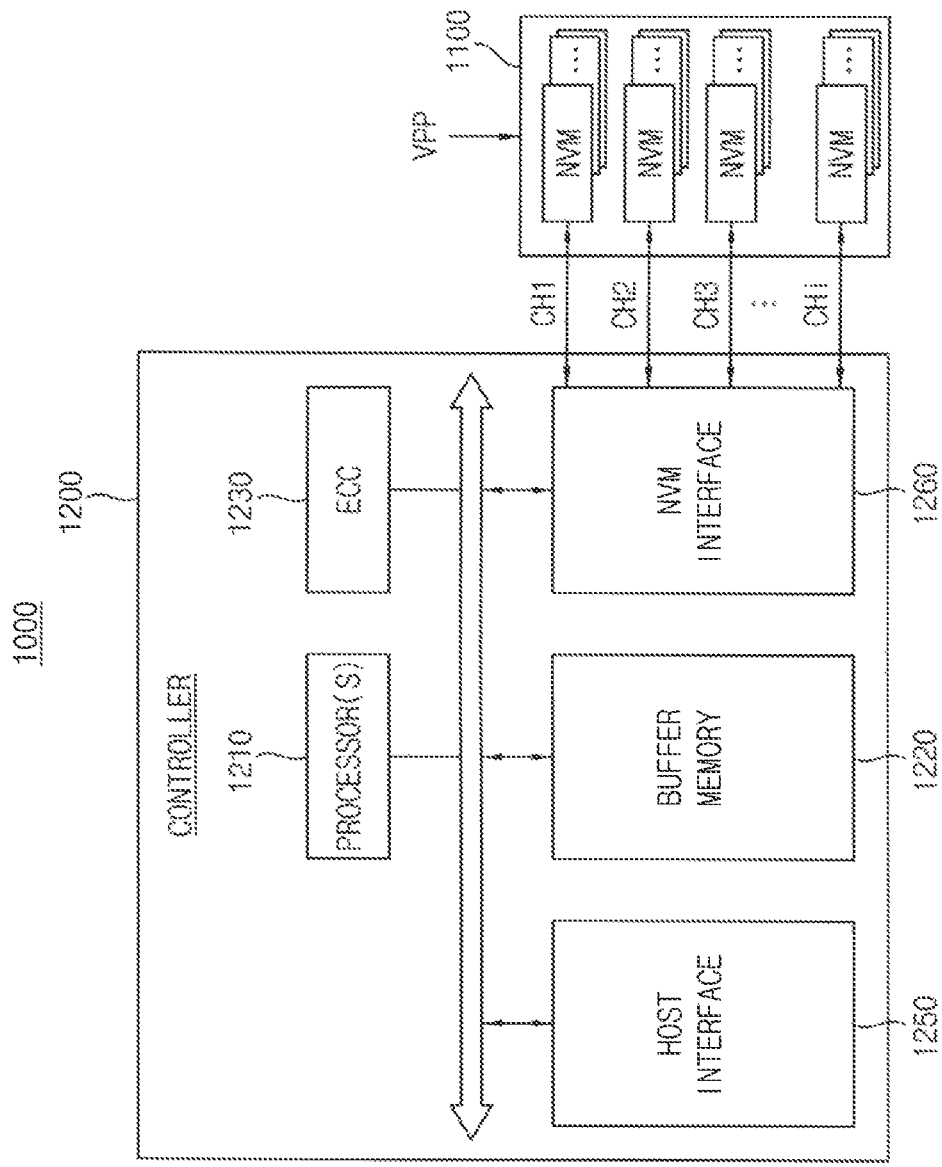
FIG. 22 is a block diagram illustrating a solid state disk or solid state drive (SSD) according to at least some example embodiments of the inventive concepts

FIG. 22 is a block diagram illustrating a solid state disk or solid state drive (SSD) according to at least some example embodiments of the inventive concepts.

Referring to FIG. 22, SSD 1000 includes multiple nonvolatile memory devices 1100 and an SSD controller 1200.

The nonvolatile memory devices 1100 may be optionally supplied with an external high voltage (or a second power supply voltage) VPP. Each of the nonvolatile memory devices 1100 may include the nonvolatile memory device 30 of FIG. 3. Therefore, each of the nonvolatile memory devices 1100 may include a calculation circuit connected between a page buffer circuit and a data input/output circuit. The calculation circuit performs matrix-vector multiplication on information bits and weight bits based on a calculation window and does not provide the data input/output circuit with a result of the matrix-vector multiplication until the matrix-vector multiplication is completed on all of the information bits and the weight bits. Therefore, each of the nonvolatile memory devices 1100 may reduce power consumed by input/output path. In addition, the calculation circuit is formed in a second semiconductor layer under a first semiconductor layer in which a memory cell array, and thus a degree of integration of each of the nonvolatile memory devices 1100 may be improved.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 includes multiple memory lines each storing data or a command. The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100.

The nonvolatile memory device or a memory system may be packaged in various forms.

One or more example embodiments of the inventive concepts may be employed by various electronic devices which include nonvolatile memory devices.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A nonvolatile memory device comprising:
a memory cell array including a plurality of nonvolatile memory cells;
a page buffer circuit connected to the memory cell array through a plurality of bit lines;
a calculation circuit configured to perform a calculation on information bits and weight bits based on a calculation window having a first size, the information bits and weight bits being included in a user data set, the memory cell array being configured to store the user data set, the calculation circuit being further configured to receive the user data set through the page buffer circuit, the calculation including performing a multiplication operation on a matrix of bits within the calculation window from among the information bits; and
a data input/output (I/O) circuit connected to the calculation circuit,
wherein the calculation circuit is further configured to provide an output data set to the data I/O circuit in response to the calculation circuit completing the calculation with respect to all of the information bits and the weight bits, and
wherein the output data set corresponds to a result of the completed calculation.

2. The nonvolatile memory device of claim 1, further comprising:
an error correction code (ECC) engine configured to,
correct at least one error bit in the information bits and the weight bits based on parity data associated with the user data set, and
provide corrected data set to the calculation circuit.

3. The nonvolatile memory device of claim 1, wherein the calculation circuit comprises:
a shift register block configured to,
divide the weight bits based on the calculation window to provide feature maps sequentially, and
divide the information bits based on a correlation between each of the feature maps and the information bits to provide activations sequentially;
a multiplication and accumulation (MAC) circuit configured to,
perform matrix-vector multiplication on each of the feature maps and each of the activations,
accumulate a result of the matrix-vector multiplication, and
provide the output data set,
the output data set being generated by completing the performance of the matrix-vector multiplication on the feature maps and the activations; and
a data buffer configured to store the output data set to provide the output data set to the data I/O circuit in response to a write enable signal.

4. The nonvolatile memory device of claim 3, wherein the shift register block comprises:
a first shift register configured to,
arrange the weight bits into the feature maps, such that the feature maps each have a P*Q matrix configuration, and
shift the weight bits such that the feature maps are output, sequentially, based on a first calculation window to output first shifted bits,
P and Q being natural numbers; and
a second shift register configured to,
arrange the information bits into the activations such that the activations correspond to a plurality of sub data sets, each having an L*L matrix configuration, based on the correlation, and
shift the information bits such that the activations are output based on a second calculation window, each having a P*Q matrix configuration, sequentially, to output second shifted bits,
L being a natural number greater than three.

5. The nonvolatile memory device of claim 4, wherein the second shift register is configured to,
shift the second calculation window in a first direction such that 2P information bits in a second direction are repeatedly selected with respect to two consecutive positions of the second calculation window until the second calculation window reaches a boundary of the activations, and
shift the second calculation window by L-P in response to the second calculation window reaching the boundary of the activations.

6. The nonvolatile memory device of claim 4, wherein the MAC circuit comprises:
a multiplication circuit configured to,
receive the first shifted bits and the second shifted bits, and
multiply information bits in one of the activations by weight bits in a corresponding one of the feature maps to provide a multiplied result as an output; and
an accumulation circuit configured to accumulate the output of the multiplication circuit to provide the output data set.

7. The nonvolatile memory device of claim 6, wherein the multiplication circuit comprises:
a first buffer configured to receive the first shifted bits to output the first shifted bits as the feature maps on based on the first calculation window;
a second buffer configured to receive the second shifted bits to output the second shifted bits as the activations based on the second calculation window; and
a multiplier configured to multiply an output of the first buffer by an output of the second buffer to provide a multiplied result as an intermediate calculation result.

8. The nonvolatile memory device of claim 7, wherein the accumulation circuit comprises:
an adder including a first input terminal and a second input terminal; and
a buffer,
wherein the adder is configured to add the intermediate calculation result of the multiplication circuit, received at the first input terminal, with an output of the buffer, received at the second input terminal, to provide an added result to the buffer, and
wherein the buffer is configured to feed-back an output of the adder to the second input terminal of the adder and configured to provide the output of the adder as the output data set in response to an output enable signal.

9. The nonvolatile memory device of claim 8, wherein the nonvolatile memory device is configured such that the buffer is reset in response to a reset signal after the buffer outputs the output data set.

10. The nonvolatile memory device of claim 3, wherein the data buffer includes a static random access memory (SRAM) device.

11. The nonvolatile memory device of claim 1, further comprising:
a control circuit configured to control the page buffer circuit, the calculation circuit and the data I/O circuit in response to a command and an address from an outside.

12. The nonvolatile memory device of claim 11, wherein the control circuit is further configured to,
generate a calculation control signal in response to the command and the address, and
control the calculation circuit by applying the calculation control signal to the calculation circuit.

13. The nonvolatile memory device of claim 12, wherein the calculation circuit comprises:
a shift register block configured to,
divide the weight bits based on the calculation window to provide feature maps sequentially, and
divide the information bits based on the feature maps to provide activations sequentially;
a multiplication and accumulation (MAC) circuit configured to,
perform matrix-vector multiplication on each of the feature maps and each of the activations,
accumulate a result of the matrix-vector multiplication, and
provide the output data set,
the output data set being generated by completing the matrix-vector multiplication on the feature maps and the activations; and
a data buffer configured to,
store the output data set, and
provide the output data set to the data I/O circuit in response to a write enable signal.

14. The nonvolatile memory device of claim 13, wherein the control circuit is configured to,
control the MAC circuit by providing an output enable signal and a reset signal to the MAC circuit, and
control an output operation of the data buffer by providing the write enable signal to the data buffer,
wherein the calculation control signal includes the write enable signal, the reset signal and the write enable signal.

15. The nonvolatile memory device of claim 1,
wherein the memory cell array includes a plurality of memory blocks, and
wherein each of the plurality of memory blocks comprises:
first memory cells coupled to a first word line; and
second memory cells coupled to a second word line, the second memory cells being stacked on the first memory cells.

16. The nonvolatile memory device of claim 1,
wherein the memory cell array is in a first semiconductor layer, and the first semiconductor layer includes a plurality of word lines extending in a first direction and a plurality of bit lines extending in a second direction that crosses the first direction, and
wherein the page buffer circuit, the calculation circuit and the data I/O circuit are in a second semiconductor layer under the first semiconductor layer in a third direction perpendicular to the first and second directions such that the first semiconductor layer is on the second semiconductor layer, and
wherein the second semiconductor layer includes a substrate.

17. The nonvolatile memory device of claim 16, wherein at least some portion of the page buffer circuit and at least some portion of the calculation circuit at least partially overlap the memory cell array in the third direction.

18. A memory system comprising:
at least one nonvolatile memory device; and
a memory controller configured to control the at least one nonvolatile memory device,
wherein the at least one nonvolatile memory device includes:
a memory cell array including a plurality of nonvolatile memory cells;
a page buffer circuit connected to the memory cell array through a plurality of bit lines;
a calculation circuit configured to perform a calculation on information bits and weight bits based on a calculation window having a first size, the information bits and weight bits being included in a user data set, the memory cell array being configured to store the user data set, the calculation circuit being further configured to receive the user data set through the page buffer circuit, the calculation including performing a multiplication operation on a matrix of bits within the calculation window from among the information bits; and
a data input/output (I/O) circuit connected to the calculation circuit,
wherein the calculation circuit is further configured to provide an output data set to the data I/O circuit in response to the calculation on the information bits and the weight bits being completed, and
wherein the output data set corresponds to a result of the completed calculation.

19. The memory system of claim 18, wherein the calculation circuit comprises:
a shift register block configured to,
divide the weight bits based on the calculation window to provide feature maps sequentially, and
divide the information bits based on the feature maps to provide activations sequentially;
a multiplication and accumulation (MAC) circuit configured to,
perform matrix-vector multiplication on each of the feature maps and corresponding each of the activations,
accumulate a result of the matrix-vector multiplication, and
provide the output data set, the output data set being generated by completing the matrix-vector multiplication on the feature maps and the activations; and
a data buffer configured to store the output data set to provide the output data set to the data I/O circuit in response to a write enable signal.

20. A method of operating a nonvolatile memory device including a memory cell array having a plurality of nonvolatile memory cells, the method comprising:
providing, from the memory cell array, information bits and weight bits to a shift register block through a page buffer circuit connected to the memory cell array through a plurality of bit lines, the information bits and weight bits being included in a user data set read through the page buffer circuit;
dividing, by the shift register block, the information bits and weight bits into activations and feature maps, respectively;
performing, by a calculation circuit, matrix-vector multiplication on the activations and the feature maps based on a calculation window; and
providing an output data set in response to the calculation circuit completing the matrix-vector multiplication with respect to all of the activations and the feature maps, the output data set corresponding to a result of the completed matrix-vector multiplication.

* * * * *